US010004169B2

(12) United States Patent
Nozawa

(10) Patent No.: US 10,004,169 B2
(45) Date of Patent: Jun. 19, 2018

(54) BULK COMPONENT SUPPLY DEVICE AND COMPONENT MOUNTER DEVICE

(71) Applicant: FUJI MACHINE MFG. CO., LTD., Chiryu-shi (JP)

(72) Inventor: Mizuho Nozawa, Nukata-gun (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 457 days.

(21) Appl. No.: 14/428,543

(22) PCT Filed: Sep. 20, 2012

(86) PCT No.: PCT/JP2012/074105
§ 371 (c)(1),
(2) Date: Mar. 16, 2015

(87) PCT Pub. No.: WO2014/045377
PCT Pub. Date: Mar. 27, 2014

(65) Prior Publication Data
US 2015/0282399 A1    Oct. 1, 2015

(51) Int. Cl.
*H05K 13/04* (2006.01)
*B65G 47/30* (2006.01)
(Continued)

(52) U.S. Cl.
CPC ......... *H05K 13/0408* (2013.01); *B65G 47/30* (2013.01); *H05K 13/028* (2013.01);
(Continued)

(58) Field of Classification Search
CPC .......... H05K 13/0015; H05K 13/0084; H05K 13/02; H05K 13/021; H05K 13/022;
(Continued)

(56) References Cited

U.S. PATENT DOCUMENTS 4,951,383 A * 8/1990 Amao .................. H05K 13/021
29/721
5,649,356 A * 7/1997 Gieskes ............... H05K 13/028
29/710
(Continued)

FOREIGN PATENT DOCUMENTS

JP          11046092 A   *  2/1999
JP        2000-022388 A       1/2000

OTHER PUBLICATIONS

Machine translation of description section of JPH1146092 provided by EPO website (espacenet.com).*
(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57)     ABSTRACT

A bulk component supply device which is moved together with a mounting head which mounts electronic circuit components on a circuit substrate and of a component mounter device equipped with that bulk component supply device is disclosed. A bulk component driving device of the bulk component supply device is non-detachably provided on head main body of the mounting head, and a passage-equipped component case in which a component case and a component passage are fixed is detachably attached to head main body by a passage-equipped component case attachment device. When the holding by passage-equipped component case attachment device is in a released state, the passage-equipped component case can be removed while the bulk component driving device is held as in on head main body, and exchanged with a different passage-equipped component case. This exchange can be performed automatically by a passage-equipped component case exchange unit.

5 Claims, 13 Drawing Sheets

(51) Int. Cl.
*H05K 13/02* (2006.01)
*H05K 13/00* (2006.01)

(52) U.S. Cl.
CPC ....... *H05K 13/043* (2013.01); *H05K 13/0084* (2013.01); *Y10T 29/53178* (2015.01); *Y10T 29/53191* (2015.01)

(58) Field of Classification Search
CPC .... H05K 13/028; H05K 13/029; H05K 13/04; H05K 13/0404; H05K 13/0408; H05K 13/0413; H05K 13/0417; H05K 13/043; H05K 13/0434; H05K 13/0452; H05K 13/0478; B65G 47/30
USPC ......... 29/739, 740, 743, 757, 759, 771, 786, 29/809; 198/443
See application file for complete search history.

(56) References Cited

U.S. PATENT DOCUMENTS

| | | | |
|---|---|---|---|
| 6,195,876 B1* | 3/2001 | Koyama | H05K 13/028 29/33 J |
| 2008/0217394 A1* | 9/2008 | Okada | H05K 13/0417 235/375 |

OTHER PUBLICATIONS

U.S. Appl. No. 14/428,498, filed Mar. 16, 2015, Nozawa.
International Search Report dated Oct. 30, 2012 in PCT/JP2012/074105 Filed Sep. 20, 2012.

* cited by examiner

BULK COMPONENT SUPPLY DEVICE AND COMPONENT MOUNTER DEVICE

TECHNICAL FIELD

The present disclosure relates to a bulk component supply device and component mounter device, in particular it relates to a bulk component supply device which is moved together with a mounting head which mounts electronic circuit components on a circuit substrate, and a component mounter device equipped with that bulk component supply device.

BACKGROUND ART

In patent literature 1 below, multiple forms of a component mounter device in which multiple bulk components are moved together with suction nozzles relative to a circuit board and mounted on a circuit board are disclosed. One of those, as well as having four suction nozzles provided at equal angle intervals on a head provided rotatably around an axis line parallel to the vertical direction, has a magazine for each of those suction nozzles detachably attached. Magazines are equipped with a storage passage extending in the vertical direction and multiple bulk components are stored arranged in a line in the vertical direction such that they move to a component outlet under their own weight. Suction nozzles are positioned relative to a component mounting location on a circuit board by the rotation of the head and the movement in the X-axis and Y-axis directions of the circuit board, and bulk components stored in the storage passage are mounted on the circuit board one by one. Magazines replenished with bulk components from the component storehouse are held on a rack provided separately from the head, and these are exchanged with a magazine attached to the head such that bulk component replenishment and so on is performed. A movable pipe is provided on the component storehouse and the entry of bulk components inside the component storehouse to the storage passage is encouraged by the movement in the vertical direction of that pipe. For a different form of a component mounter device, a component storehouse which has a suction nozzle, magazine, and movable pipe is provided as one body, such that exchange with respect to the head can be performed all at once.

CITATION LIST

Patent Literature

Patent Literature 1
JP-A-2000-22388

SUMMARY

Problem to be Solved

Taking account of the above background circumstances, the present disclosure has been developed, and it is an object of the present disclosure to improve the practicality of a bulk component supply device which is moved together with a mounting head which mounts electronic circuit components on a circuit base material; and a component mounter device equipped with that bulk component supply device.

The above problems can be solved by a bulk component supply device which is moved together with a mounting head for mounting electronic circuit components on a circuit substrate, comprising: (A) a bulk component case which houses electronic circuit components in a loosely packed state as bulk components; (B) a component passage which arranges bulk components in a line and guides them to a component supply section; and (C) a bulk component transfer device which transfers bulk components to the component passage and which is equipped with a bulk component driving device which applies moving force in the direction of the component passage to bulk components inside the bulk component case; wherein, the bulk component case and the component passage are fixed to each other to configure a passage-equipped component case wherein a leading passage-equipped component case which is the passage-equipped component case which was moved together with the mounting head and a following passage-equipped component case which is a separate passage-equipped component case to the leading passage-equipped component case are exchangeable with at least the driving source of the bulk component driving device being held on the mounting head. The exchange may be performed manually or automatically.

The above problems are also solved by a component mounter device including (a) the bulk component supply device of the present disclosure; (b) a movable mounting head which holds that bulk component supply device and a suction nozzle which picks up and takes out bulk components from the component supply section of the component passage; (c) a circuit substrate holding device which holds a circuit substrate; and (d) a head moving device which imparts movement on the mounting head as is required for the mounting of bulk components to the circuit substrate.

Included in circuit substrate are, for example, (a) a printed wiring board on which electronic circuit components have not yet been mounted; (b) a printed circuit board on one side of which electronic circuit components have been loaded and electrically connected, and on the other side of which electronic circuit components have not yet been mounted; (c) a substrate configured from a chip-equipped board on which a bare chip has been loaded; (d) a substrate on which is loaded an electronic circuit component provided with a ball grid array; and (e) a substrate which is not a flat board but which is three dimensional.

Effects

According to the bulk component supply device of the present disclosure, by exchanging a leading passage-equipped component case and a following passage-equipped component case, for example: component replenishment when electronic circuit components have run out in a passage-equipped component case; change in supplied components based on a change in the type of electronic circuit components to be mounted on the circuit substrate; exchange to a correct passage-equipped component case when a problem occurs with a leading passage-equipped component case; and so on; can be performed easily. It is also possible to exchange only the component supply case with the component passage held on the mounting head as is, but, for example, when it is necessary to change the component passage based on a change to the type of electronic circuit component to be mounted on the circuit substrate, it is easier if the component passage is exchanged as one with the component case. Also, if the passage-equipped component case is exchanged with at least the driving source of the bulk component driving device being held as is on the mounting head, it is not required to make the wires and conduits which supply moving energy such as current and signals to the driving source disconnectable/connectable, and exchange can be performed easily. Further, it is also possible to share at least the driving source of the bulk component driving device with respect to multiple passage-equipped component cases, which means equipment costs can be reduced.

According to the component mounter device of the present disclosure, the effects of the bulk component supply device of the present disclosure can be realized.

EXAMPLE FORMS

Below, several example forms are illustrated and described. Each form, the same as the claims, is divided into clauses, a numbers is attached to each clause, and disclosure is performed with reference to the numbers of other clauses where appropriate. This is simply to facilitate understanding and in no way restricts the combination of structural elements to an item described in each clause below.

(1) A bulk component supply device which is moved together with a mounting head for mounting electronic circuit components on a circuit substrate, comprising:

a bulk component case which houses electronic circuit components in a loosely packed state as bulk components; a component passage which arranges bulk components in a line and guides them to a component supply section; and a bulk component transfer device which transfers bulk components to the component passage and which is equipped with a bulk component driving device which applies moving force in the direction of the component passage to bulk components inside the bulk component case; wherein, a leading component case which is the bulk component case which was moved together with the mounting head and a following component case which is a separate bulk component case to the leading component case are exchangeable.

Component case exchange may be performed automatically or may be performed manually by an operator. At least one of a component passage and at least one section of a bulk component transfer device may be provided fixed to a bulk component case such that exchange is performed integrally. The entire bulk component supply device may also be exchangeable.

(2) The bulk component supply device according to clause (1), wherein the leading component case and the following component case are exchangeable with at least the driving source of the bulk component driving device held as is on the mounting head.

The bulk component driving device may be held entirely as is on the mounting head such that exchange is not performed; or a section including the driving source of the bulk component driving device may be held as is on the mounting head, and a separate section may be provided fixedly to a component case and removed from the mounting head together with the component case, such that exchange is performed. For example, for a bulk component driving device which includes a rotating disk and a rotating disk driving device as in the bulk component driving device described in the embodiment, the electric motor which makes up the rotating disk driving device may be attached to the head main body, and the rotating disk may be attached to the component case side and be removed together with the component case.

(3) The bulk component supply device according to clause (1) or (2), wherein the bulk component case and the component passage are fixed to each other to configure a passage-equipped component case.

In the bulk component supply device of this clause, it is possible to exchange the leading passage-equipped component case and the following passage-equipped component case.

(4) A component mounter device including: the bulk component supply device according to any of clauses (1) to (3); a movable mounting head which holds that bulk component supply device and a suction nozzle which picks up and takes out bulk components from the component supply section of the component passage; a substrate holding device which holds a circuit substrate; and a relative movement imparting device which imparts relative movement on the substrate holding device and the mounting head as is required for the mounting of bulk components to the circuit base material.

There may be one or multiple bulk component supply devices. In the case of multiple, the bulk components which each bulk component supply device supplies may be the same type or different types.

The relative movement imparting device may be a device which imparts movement on the mounting head in both directions perpendicular to a horizontal plane parallel to the circuit substrate held in the substrate holding device, or it may be a device which imparts movement in one direction on the substrate holding device and movement in the other direction on the mounting head. The relative movement imparting device, in addition to horizontal direction movement, may impart movement in the direction perpendicular to the circuit substrate on at least one of the mounting head and substrate holding device.

(5) The component mounter device according to clause (4), wherein the relative movement imparting device includes a head moving device which moves the mounting head with respect to the substrate holding device, and wherein the component mounter device further includes a following bulk component case holding device which holds the following bulk component case in a position inside the head moving region which is the region in which the mounting head is moved by the head moving device such that the following component case can be delivered to the mounting head.

Both the substrate holding device and the mounting head may be moved, but a component mounter device in which only the mounting head is moved can have a simpler configuration. It is possible to provide a dedicated "following bulk component case holding device" of this clause; but the "following bulk component case holding device" may be integrated with the "bulk component case moving device" of clause (7) below. It is considered to be functioning as the "following bulk component case holding device" in the state in which the bulk component base moving device is holding the following bulk component case and is stopped inside the head moving region.

(6) The component mounter device according to clause (4) or (5), wherein the relative movement imparting device includes a head moving device which moves the mounting head with respect to the substrate holding device, and wherein the component mounter device further includes a following bulk component case holding device which holds the following bulk component case in a position outside the head moving region which is the region in which the mounting head is moved by the head moving device such that the following component case can be removed/attached.

It is possible to provide a dedicated "following bulk component case holding device" of this clause; but, in the same way as described with regard to clause (5), the "following bulk component case holding device" may be integrated with the "bulk component case moving device" of clause (7) below.

In this case, while the leading component case is being used by being moved together with the mounting head, if the following component case is held by the following bulk component case holding device and stopped in a position outside the head moving region, bulk component replenishment can be performed during this interval.

(7) The component mounter device according to any of the clauses (4) to (6), wherein the relative movement imparting device includes a head moving device which moves the mounting head with respect to the substrate holding device, and wherein the component mounter device further includes a bulk component case moving device to move the following component case from a position outside of the head moving region which is the region where the mounting head can be moved by the head moving device to a position inside the head moving region.

It is desirable for the bulk component case moving device to move both the leading component case and the following component case between positions inside and outside the head moving region, but this is not essential. For example, the leading component case may be ejected to a pre-defined collection section within the head moving region such that removal afterwards is possible.

(8) The component mounter device according to any of clauses (4) to (7), further including a bulk component case mounting device which mounts the following component case on the mounting head.

(9) The component mounter device according to any of clauses (4) to (7), further including a bulk component case exchange device which exchanges the leading component case and the following component case.

Component case exchange is performed automatically. It is also possible to consider bulk component case exchange device as integrating the bulk component case mounting device of clause (8). It should be noted that bulk component case mounting device or bulk component exchange device can be provided on the mounting head side.

(10) The component mounter device according to any of the clauses (4) to (7), wherein the relative movement imparting device includes a head moving device which moves the mounting head with respect to the substrate holding device, and wherein the component mounter device further includes: a movable member equipped with two case holding sections which detachably hold the respective passage-equipped component cases, the movable member moving the two case holding sections to a first position positioned outside the head moving region which is the region where the mounting head is moved by the head moving device and a second position positioned inside the head moving region; a movable member driving device for moving the movable member to the first position and the second position; and a passage-equipped component case exchange device wherein one of the two case holding sections receives the leading component case from the mounting head, and the other case holding section delivers the following component case to the mounting head.

Exchange of the leading component case and the following component case is performed automatically. In particular, because the movable member can hold both the leading component case and the following component case, removal/attachment of component cases from/to the mounting head can be performed all together, so exchange efficiency is good, and when exchange is performed during the mounting work of electronic circuit components to a series of circuit substrates, the mounting interruption time due to exchange can be shortened, and drops in mounting efficiency can be curtailed. Also, in the state with the two case holding sections positioned outside the head moving region, an operator can perform work such as component replenishment and component case exchange while component mounting is being performed.

(11) The component mounter device according to clause (10), wherein the movable member, the movable member driving device, and the bulk component case exchange device are supported integrally on an exchange device main body to configure a bulk component case exchange unit, and that bulk component case exchange unit can be attached/removed to/from the main body of the component mounter device.

With this, handling of the movable member, the movable member driving device, and the bulk component case exchange device becomes easy. The movable member and so on can be attached/removed to/from the main body of the component mounter device all at once, so that setting, exchange, maintenance, and so on can be performed.

(12) The component mounter device according to clause (11), wherein the bulk component case exchange unit includes an exchange unit control computer which controls that bulk component case exchange unit, and a connecting section (connector) which connects that exchange unit control computer to the mounter device control computer which controls the component mounter device.

(13) The component mounter device according to clause (11) or (12), further including an exchange unit mounting table on which the bulk component case exchange unit can be attached.

(14) The component mounter device according to clause (11) or (12) wherein the component mounter device mounts on the circuit substrate held by the circuit substrate holding device the electronic circuit components supplied from both the bulk component case exchange unit and arranged-component feeders which hold multiple of the same type of electronic circuit components in an arranged state and supply from a component supply section the arranged components which are the electronic circuit components in the arranged state consecutively one by one; and wherein the component mounter device includes a component supply table to which the bulk component case exchange unit and the arranged-component feeders are attachable. For arranged-component feeders there are, for example, tape feeders, stick feeders, bulk component feeders (this refers to a bulk component supply device as disclosed in clause (1) which are not moved together with the mounting head), and so on. In this clause, the component supply table functions as the exchange unit attachment table disclosed in clause (13).

(15) The component mounter device according to clause (14), wherein the component supply table is equipped with multiple installation sections; and the bulk component case exchange unit attachment device which attaches the bulk component case exchange unit, and the arranged-component feeder attachment device which attaches the arranged-component feeder, have the same configuration with respect to those multiple installation sections.

If the configuration of the bulk component case exchange unit attachment device and the arranged-component feeder attachment device is the same, there is the benefit that both can be attached alternately to a shared installation section, but this is not essential.

(16) The component mounter device according to clause (14) or (15), where in the component supply table can be attached/removed to/from the main body of the component mounter device. The component supply table may be directly attached/removed to/from the main body of the component mounter device, or the component supply table may be supported on a cart which is a kind of component supply table supporting member, and may be connected/disconnected to/from the main body of the component mounter device along with the cart. With this, for example, changes to the type and quantity of arranged-component feeders and the type and quantity of bulk component case exchange units can be handled by exchange of the component supply table. In other words, it is possible to attach arranged-component feeders and bulk component case exchange units to a component supply table removed from the main body of the component mounter device, and they can be put on standby for usage.

(17) The component mounter device according to any of clauses (11) to (16), wherein the bulk component case exchange unit is equipped with an exchange unit information holding section for holding exchange unit information which makes it possible to individually recognize those bulk component case exchange units.

For the information holding section, items which make recognition possible using an optical recognition device such as barcodes or two-dimensional codes, items which make recognition possible using electromagnetic waves such as RFID (Radio Frequency Identification) RF tags which use RF tags and an RFID reader-writer, memory of the bulk component case exchange unit control computer, and so on can be used.

(18) The component mounter device according to any of the clauses (14) to (17), wherein the component supply table is equipped with multiple installation sections and wherein the component mounter device further includes, among those multiple installation sections, an installation section specifying device which specifies the installation to which the bulk component case exchange unit is attached; and wherein, based on the specification result of the installation section specifying device, the head moving device is made to perform the necessary operations for exchanging the leading component case and the following component case by the bulk component case exchange device.

The component mounter device of this clause can be realized by having the installation section specifying section device include the appropriate combination of features from clause (17) above and clauses (19) and (20) below; or alternatively by further having the installation section specifying section device include a network to connect to a host computer which controls overall multiple component mounter devices, and a host computer and the multiple component mounter devices.

(19) The component mounter device according to any of clauses (1) to (18) wherein the bulk component case is equipped with a bulk component case information holding section which holds bulk component case information by which that bulk component case can be individually identified.

(20) The component mounter device according to any of clauses (1) to (19) wherein the bulk component case is equipped with a housed component type information holding section which holds housed component information which is information of the type of bulk components that are housed in that bulk component case.

(21) The component mounter device according to any of clauses (1) to (20), further including: a bulk component type acquisition device which can acquire the type of bulk components housed in the following bulk component case held on the mounting head; and at least one of, a reporting device which reports the fact there is a difference when the bulk component type acquired by that bulk component type acquisition device is different from a planned bulk component type, and a mounting operation prohibition section which prohibits the component mounting operation of the component mounter device.

With this, it is possible to prevent a bulk component case housing electronic circuit components different to those planned from being attached to the mounting head and the electronic circuit components mounted on a circuit substrate.

(22) The component mounter device according to any of clauses (14) to (21), further including an exchange unit positioning section for deciding the attachment position, which is one of the multiple installation sections of the component supply table, of the bulk component case exchange unit to which the bulk component case housing the type of bulk components which are required for performing that program which is allocated based on the program for mounting electronic circuit components to a circuit base material.

By having a component mounter device which includes an exchange unit positioning section and displaying the exchange unit position decided by the exchange unit positioning section on a display device, or by turning on the lamps corresponding to each of the multiple installation sections of the component supply table, and so on, it is possible to support the attachment work of the bulk component case exchange unit to the component supply table performed by an operator, and further, if that information is memorized in a memory section, it can be used for automatic exchange of bulk component cases, and for performing the judgment as to whether the component information acquired by the bulk component type acquisition device differs from the planned component information.

This is a perspective view showing a section of an electronic circuit component mounting line equipped with multiple mounter modules which form the component mounter device of one embodiment of the claimable invention.

FIG. 2

This is a side view (partial cross section) showing the tape feeder of the component supply device of the above mounter module.

FIG. 3

This is a side view showing the above mounter module.

FIG. 4

This is a perspective view showing the mounting head and head moving device of the above mounter module.

FIG. 5

This is a perspective view showing the above mounting head.

FIG. 6

This is a perspective view showing the area around the component takeout position of the above mounting head.

FIG. 7

This is a side view showing the passage-equipped component case of the bulk component supply device provided at the above component takeout position.

FIG. 8

This is a top view showing the above passage-equipped component case.

FIG. 9

This is a side view showing the bulk component driving device and passage-equipped component case attachment device of the above bulk component supply device, and showing the unclamped state of the passage-equipped component case attachment device.

FIG. 10

This is a side view showing the clamped state of the above passage-equipped component case attachment device.

FIG. 11

This is a side view showing the passage-equipped component case exchange unit which exchanges the above passage-equipped component case.

FIG. 12

This is a top view showing items such as the passage-equipped component case exchange device of the above passage-equipped component case exchange unit.

FIG. 13

This is a side view showing items such as the passage-equipped component case exchange device of the above passage-equipped component case exchange unit.

FIG. 14

These are drawings to illustrate the exchange of component cases by the above passage-equipped component case exchange unit.

FIG. 15

This is a block diagram showing conceptually items such as the control device of the above mounter module.

DESCRIPTION OF EMBODIMENTS

Below, embodiments are described with reference to the figures. It should be noted that the embodiments are non-limiting and can be embodied in various changed forms based on the knowledge of someone skilled in the art, such as the forms given in the above section "Example Forms."

Figure 1:
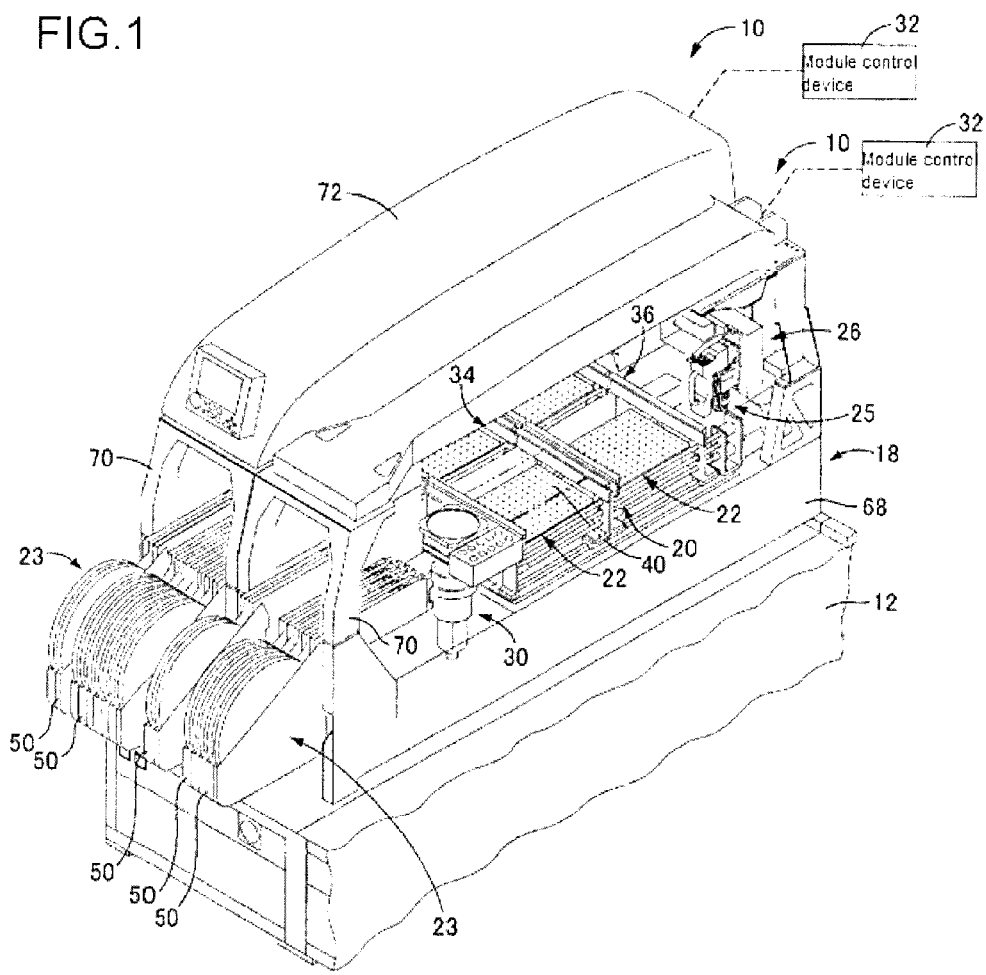
FIG. 1

Shown in FIG. 1 are multiple mounter modules 10 which form component mounter devices which are one embodiment. These mounter modules 10 are arranged and fixed in a line adjacent to each other on top of a shared single body base 12 to configure a mounting line. Multiple mounter modules 10 divide and perform the mounting of electronic circuit components to a circuit substrate.

With regard to mounter module 10, details are disclosed, for example, in JP-A-2004-104075, and the sections except those sections which relate to the present embodiment are described simply below. Each mounter module 10 is, in the present embodiment, as shown in FIG. 1, equipped with module main body 18 which forms the main body of the component mounter device, board conveyance device 20 which forms the substrate conveyance device, board holding device 22 which forms the substrate holding device, component supply device 23, bulk component supply system 24 (refer to FIG. 5), mounting head 25, head moving device 26 which forms the device which applies relative movement, reference mark imaging device 28 (refer to FIG. 4), component imaging device 30, and module control device 32.

Board conveyance device 20, in the present embodiment, is equipped with two board conveyors 34 and 36, and conveys circuit board 40 which is a type of circuit substrate in a horizontal direction which is a direction parallel to the direction in which multiple mounter modules 10 are lined up. In this embodiment, "circuit board" is used as a general term for printed wiring boards and printed circuit boards. Board holding device 22 is provided on each of the two board conveyors 34 and 36 on module main body 18, and although omitted from the figure, each is equipped with a supporting member for supporting circuit board 40 from below and a clamping member for clamping the edge section on each side in a direction parallel to the conveyance direction of circuit board 40, and holds circuit board 40 with the component mounting surface onto which electronic circuit components are mounted in a horizontal orientation. In this embodiment, the conveyance direction of circuit board 40 by board conveyance device 20 is the X-axis direction, or the left-right direction; and the Y-axis direction, or the front-rear direction, is in a flat plane parallel to the component mounting surface of circuit board 40 held in board holding device 22 and is perpendicular to the X-axis direction in that horizontal plane.

Figure 2:
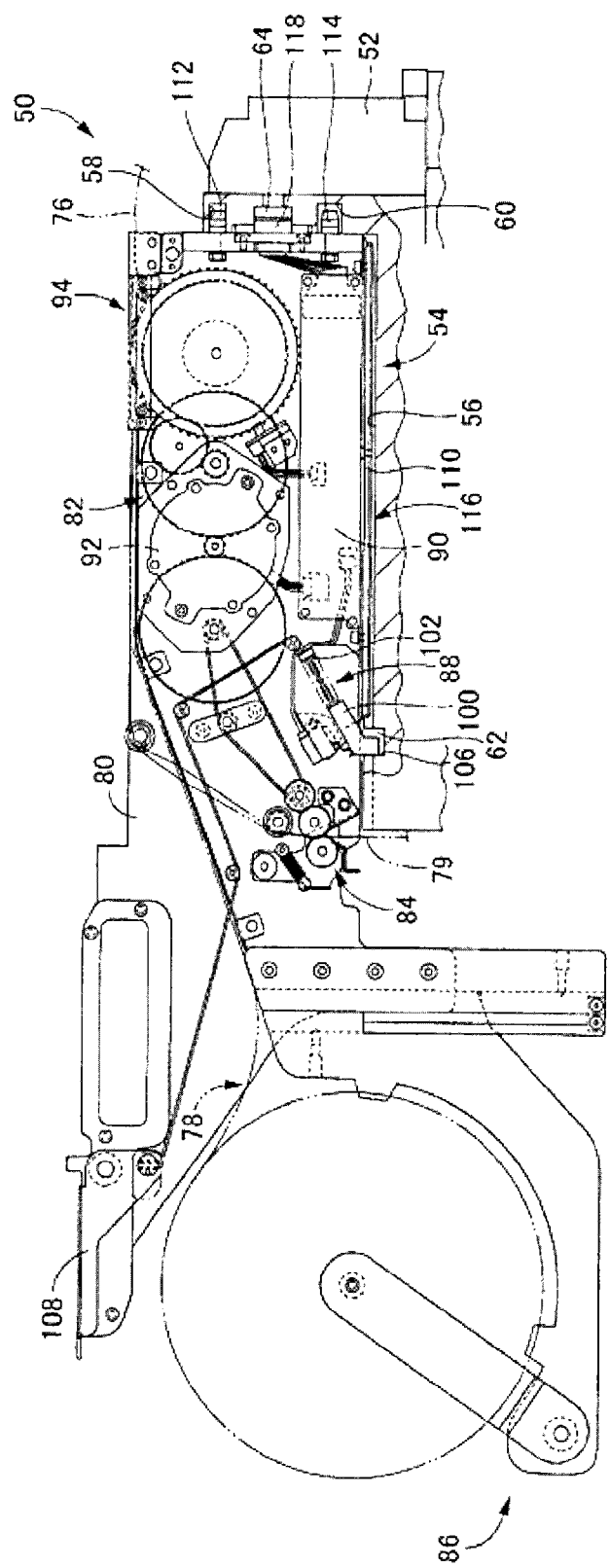

This component supply device 23 supplies electronic circuit components by multiple tape feeders 50 which form arranged-component feeders. These tape feeders 50, as shown in FIG. 2, are detachably attached to component supply table 52. Multiple installation sections 54 are provided on the front of component supply table 52. These installation sections 54, in the present embodiment, are each equipped with groove 56 extending in the front-rear direction (the left-right direction in FIG. 2), pair of positioning holes 58 and 60, and groove 62 parallel to the left-right direction (the direction coming straight up out of the page in FIG. 2); and are provided regularly spaced on the component supply table 52 separated by an appropriate gap in a direction parallel to the left-right direction. Also provided on component supply table 52 is connector 64, in the section between each positioning hole 58 and 60 of the multiple installation sections 54. It should be noted that, with regard to the overall mounter module 10, the side on which component supply device 23 is provided in the Y-axis direction is the front side or the facade; but with regard to component supply table 52, tape feeders 50, and the bulk component case exchange unit described below, conversely, in the Y-axis direction, the board conveyance device 20 side is the front and the component supply device 23 side is the rear.

Figure 3:
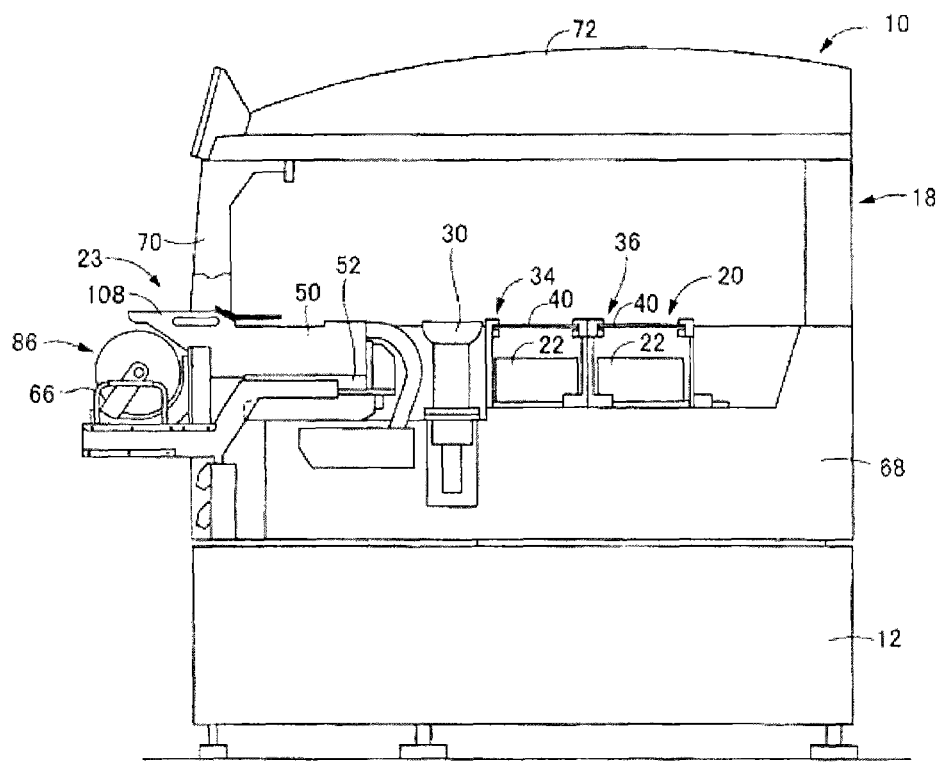

On component supply table 52, handles 66 are provided at the respective ends in the left-right direction of the rear section (handle 66 at one end is shown in FIG. 3), and component supply table 52 is attached and removed to/from base 68 of module main body 18 by an operator, and is fixed to base 68 in an attached state. In that state, the front-rear direction of component supply table 52 is parallel to the Y-axis direction, and the left-right direction is parallel to the X-axis direction; the front section which is the section provided with installation sections 54 of component supply table 52 is positioned in a space surrounded by column 70 of module main body 18 and cover 72 (hereafter referred to as space inside the module), and the rear section protrudes outside module main body 18. Installation sections 54 may be provided on base 68 such that a section of base 68 is made to be the component supply table.

Tape feeder 50 has the same kind of configuration as the feeder disclosed in JP-A-2004-47951 and is described simply below. Respective electronic circuit components are held by component holding tape 76, and supplied as taped components 78 in multiple tape feeders 50. Multiple of one type of electronic circuit component are held in component holding tape 76 arranged in a line and spaced at regular intervals and are covered by cover tape 79. transfer device 82, cover tape peeling device 84, component storage device 86, engaging device 88, and tape feeder control device 90 are provided on feeder main body 80 which is the main body of tape feeder 50 (refer to FIG. 2).

Transfer device 82 has electric motor 92 as a driving source, and transfers taped components 78 a predetermined distance each time, which in the present embodiment is a distance equal to the holding interval of the electronic circuit component of component holding tape 76, such that electronic circuit components which are the arranged components held in component holding tape 76 are removed from component holding tape 76 and positioned one by one at the component takeout position. The component takeout position is set at the front end of feeder main body 80 which is an end in the lengthwise direction or the front-rear direction; this section configures component supply section 94, and electronic circuit components are supplied from component supply section 94 consecutively one by one. In the present embodiment, electric motor 92 is configured from a servo motor with an encoder. The servo motor is an electric rotational motor for which the rotational angle can be controlled accurately, but a stepping motor may be used instead of a servo motor.

Engaging device 88, with engaging member 100 being engaged with side surface 106 of groove 62 provided on component supply table 52 by the biasing of compression coil spring 102, fixes tape feeder 50 to component supply table 52. This fixing is released by engaging member 100 being separated from side surface 106 against the biasing of spring 102 by lever 108 which forms an operating member being operated by an operator. The coil spring is a spring which forms an elastic member which is a kind of biasing means.

Tape feeder 50 is engaged with groove 56 of installation section 54 by rail 110 provided on the bottom surface of feeder main body 80, and, as well as positioning protrusions 112 and 114 provided on the front of feeder main body 80 being engaged with positioning holes 58 and 60, is fixed to component supply table 52 by engaging device 88. By this, as well as tape feeder 50 being positioned in an orientation in which the lengthwise direction is parallel to the Y-axis direction and the left-right direction or the widthwise direction is parallel to the X-axis direction, tape feeder 50 is held in a state which prevents it from rising up from component supply table 52. In the present embodiment, rail 110, positioning protrusions 112 and 114, and engaging device 88 configure tape feeder attachment device 116 which forms the arranged-component feeder attachment device, and in an attached state, the front of tape feeder 50 is positioned inside a space inside the module, and lever 108 and component storage device 86 are positioned outside the space inside the module.

Connector 118 is also provided on feeder main body 80 on the front thereof and is connected to connector 64 of component supply table 52. By this, communication can be performed between tape feeder control computer 120 which forms the main part of tape feeder control device 90 and module control computer 122 (refer to FIG. 15) which forms the main part of the module control device 32, and electric power can be supplied to tape feeder 50. Electric motor 92 is controlled by tape feeder control device 90.

Figure 4:
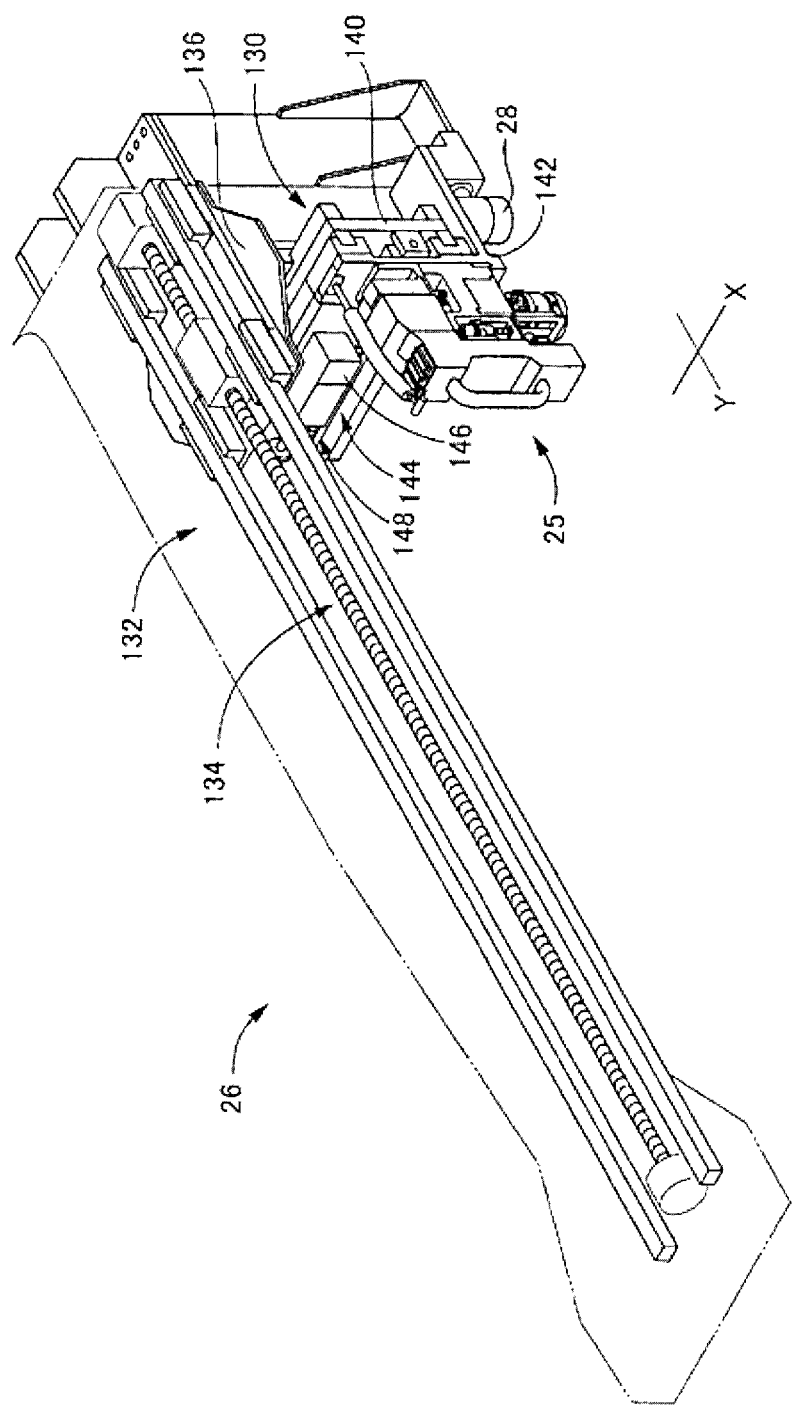

The head moving device 26, as shown in FIG. 4, is equipped with X-axis direction moving device 130 and Y-axis direction moving device 132. Y-axis direction moving device 132 is equipped with linear motor 134 provided on module main body 18 straddling the component supply section of component supply device 23 (the section configured from component supply section 94 in the case in which tape feeders 50 are attached to all the installation sections 54 of component supply table 52) and two board holding devices 22, and moves Y-axis slide 136 acting as a moving member which forms the movable member to any position in the Y-axis direction.

X-axis direction moving device 130 is provided on Y-axis slide 136, and, as well as moving in the X-axis direction with respect to Y-axis slide 136, is equipped with: a first and a second X-axis slides 140 and 142 acting as moving members which form the movable members moved respectively relatively in the X-axis direction; and X-axis slide moving device 144 (in FIG. 4, X-axis slide moving device which moves the second X-axis slide 142 is shown) for moving each of those slides 140 and 142 in the X-axis direction. The two X-axis slide moving devices, as shown by X-axis slide moving device 144, for example, include electric motor 146 which forms the driving source and transfer screw mechanism 148 which includes a screw axis and nut, with X-axis slides 140 and 142 being able to be moved to any position in the X-axis direction, and the second X-axis slide 142 being able to be moved to any position within a horizontal movement plane. A ball screw mechanism is suitable as a transfer screw mechanism. The same is also true for other transfer screw mechanisms described below. The head moving device may have the Y-axis direction moving device provided on the X-axis slide.

The mounting head 25 is detachably loaded on the second X-axis slide 142, and is moved with respect to board holding device 22 according to the movement of the second X-axis slide 142, and can be moved to any position in the head moving region which is the moving region straddling the component supply section of component supply device 23 and the two board holding devices 22.

Figure 5:
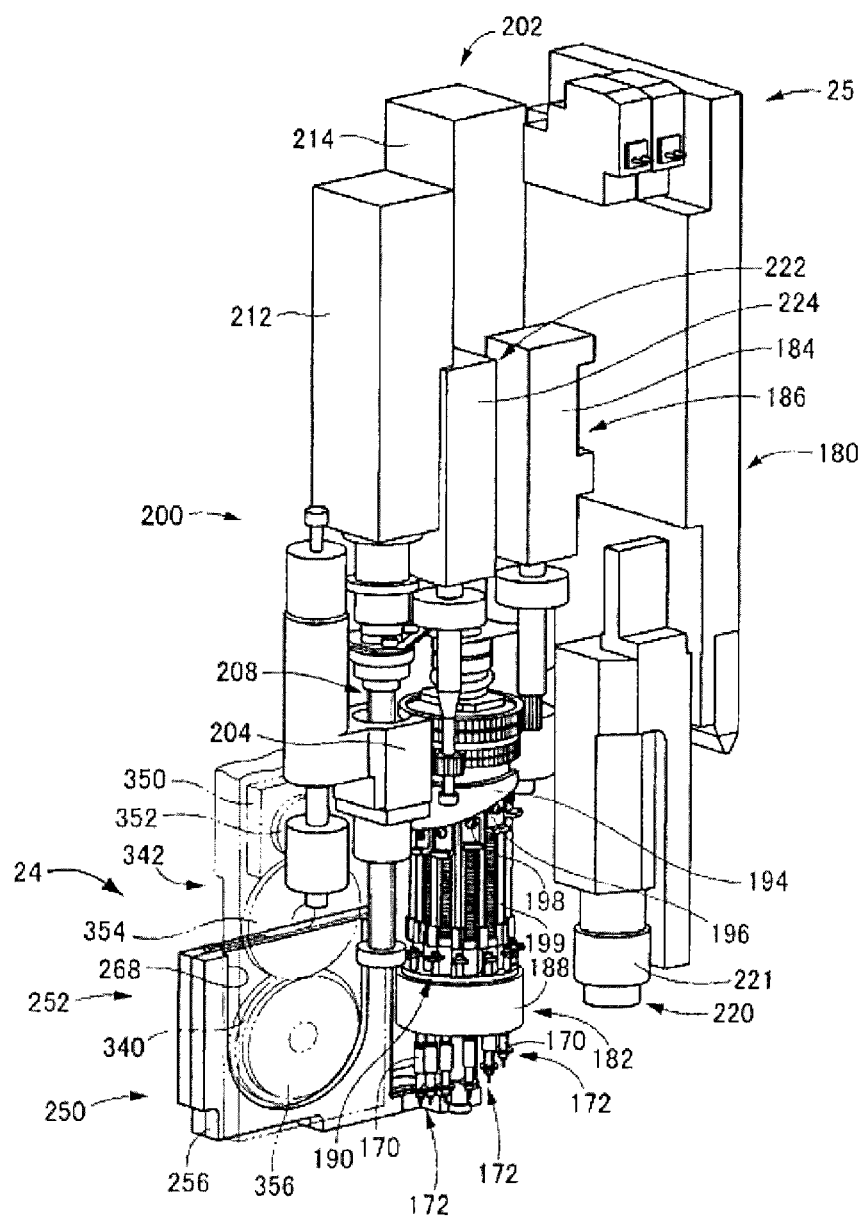

Mounting head 25 holds electronic circuit components by suction nozzles. Multiple types of mounting heads with different quantities of nozzle holders for holding a suction nozzle are prepared as mounting head 25, and one is selectably attached to the second X-axis slide 142. Mounting head 25 shown in FIG. 5 is equipped with multiple nozzle holders 170, for example three or more, and in the example shown in the figure, twelve such that a maximum of twelve suction nozzles 172 can be held.

The reference mark imaging device 28, as shown in FIG. 4, is loaded on the second X-axis slide 142, is moved together with the mounting head by head moving device 26, and captures images of reference marks (omitted from the figure) provided on circuit board 40. Also, the component imaging device 30, as shown in FIG. 1, is provided at a fixed position on the section between board conveyance device 20 of base 68 and component supply device 23, and captures images of an electronic circuit component which forms the imaging target object from below.

Described below is mounting head 25. Mounting head 25, although not yet made public, is disclosed in detail in the specifications of Japanese Patent Application 2011-206452 made by the same applicant as this application, and the sections except those sections which relate to the present embodiment are described simply below. As shown in FIG. 5, rotating body 182 is supported on head main body 180 of mounting head 25 such that it can be rotated about its own vertical axis line, and can be rotated to any angle in both forward and reverse directions about a vertical axis line by rotational driving device 186 which has electric motor 184 as its driving source.

The twelve nozzle holders 170, are each engaged at twelve positions at suitably spaced intervals on the circumference centered around the rotational axis line of rotating body 182 of the outer section of holder holding section 188 of rotating body 182, which for the present embodiment is twelve positions spaced at equal angles, and can be moved relative to the axis direction and can be rotated about their own axis line in an orientation such that that axis direction is parallel to the rotational axis line of rotating body 182. Suction nozzles 172 are held by each of these nozzle holders 170, and positive pressure and negative pressure can be selectively supplied in the suction pipe thereof by the switching of switching valve device 190 provided to correspond to each of the twelve nozzle holders 170.

The twelve suction nozzles 172 are stopped consecutively at twelve stopping positions by rotating body 182 being intermittently rotated at angles equal to the distribution angle interval of nozzle holders 170. Also, suction nozzles 172 are raised and lowered while being rotated about the rotational axis line of rotating body 182 by cam surface 196 of cam 194 provided fixedly on head main body 180, roller 198 which forms a cam follower provided on the upper end section of nozzle holder 170, and compression coil spring 199 engaged with nozzle holder 170.

Due to this, the separation in the height direction of suction nozzles 172 from board holding device 22 at the twelve stopping positions is not the same for all, and the stopping position for which that distance is the shortest is the mounting position at which electronic circuit components are mounted on circuit board 40, and the high position for which that distance is the longest is the component imaging position; a stopping position in between this mounting position and component imaging position is the component takeout position at which electronic circuit components are taken out from the bulk component supply device which is described below. When an electronic circuit component is taken out from tape feeder 50 by suction nozzle 172, the mounting of electronic circuit components removed from both a tape feeder 50 and the bulk component supply device onto circuit board 40 is performed at the mounting position, and the mounting position is also the takeout mounting position.

Figure 6:
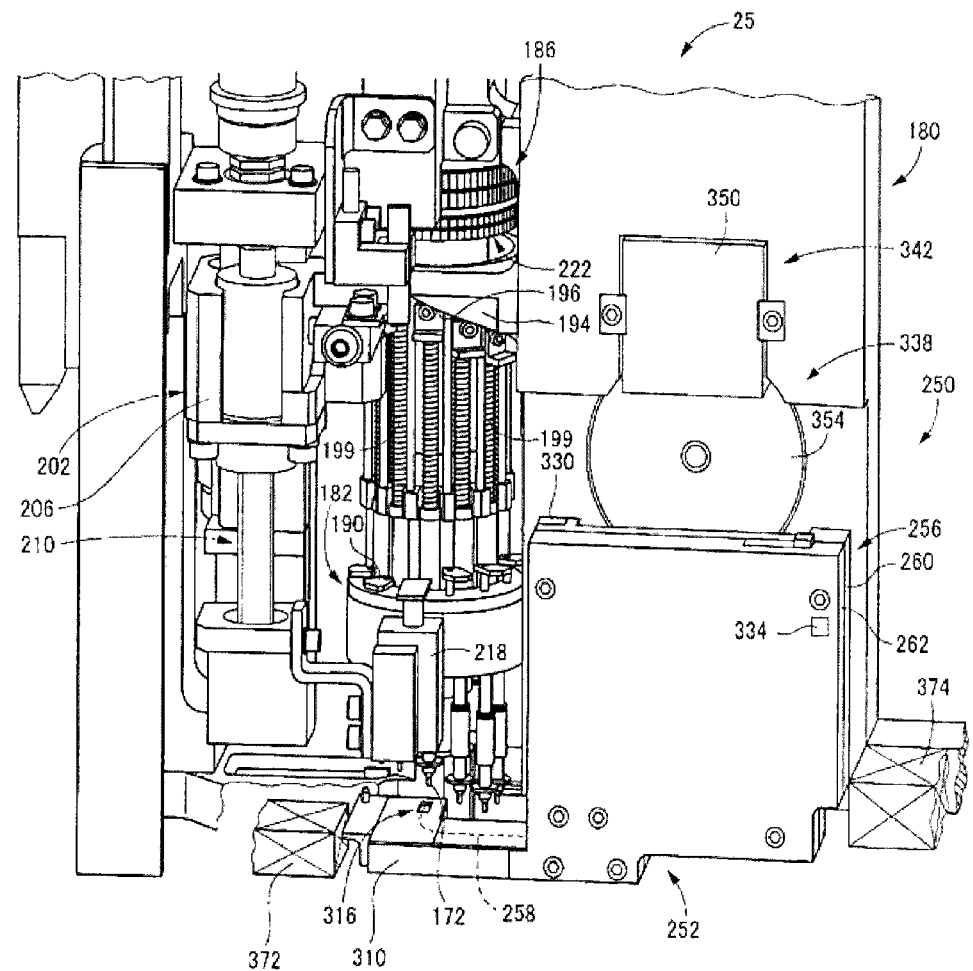

At each of the mounting position and the component takeout position, raising/lowering devices 200 and 202 are provided to raise/lower nozzle holders 170. Each of these raising/lowering devices 200 and 202, as shown in FIG. 5 and FIG. 6, includes raising/lowering members 204 and 206, transfer screw mechanisms 208 and 210, and electric motors 212 and 214. On each of the mounting position and component takeout position, as shown for the component takeout position in FIG. 6, valve switching device 218 is provided, and switching is performed of switching valve device 190 provided for the suction nozzle 172 which is stopped at the mounting position and the component takeout position.

Component imaging device 220 is provided at the component imaging position. Camera 221 of component imaging device 220 captures an image of an electronic circuit component taken out from tape feeder 50 or bulk component supply device 250 by suction nozzle 172 using a reflection device (omitted from figure). Also, nozzle holder rotational driving device 222 is provided on head main body 180 and rotates nozzle holders 170 around their own axis line. Nozzle holder rotational driving device 222 has electric motor 224 as a driving source and is a device which rotates all twelve nozzle holders 170 at the same time.

Further, mounting head control device 230 (refer to FIG. 15) is provided on head main body 180. Mounting head control device 230 is configured from mounting head control computer 232 as the main part, is connected to module control computer 122, and controls, among other things, electric motor 184 configured from a servo motor with an encoder. Each encoder 234 for electric motor 184 and so on which is shown as one representative example is connected to mounting head control computer 232.

This bulk component supply system 24 includes bulk component supply device 250. Bulk component supply device 250, as shown in FIG. 6, is provided with a section corresponding to the component takeout position of head main body 180, and is moved with respect to board holding device 22 together with mounting head 25 by head moving device 26. This bulk component supply device 250 includes passage-equipped component case 252 and bulk component transfer device 254. Passage-equipped component case 252, as shown in FIG. 7, includes bulk component base 256 (hereafter abbreviated to component case 256) and component passage 258 fixed to each other.

Figure 7:
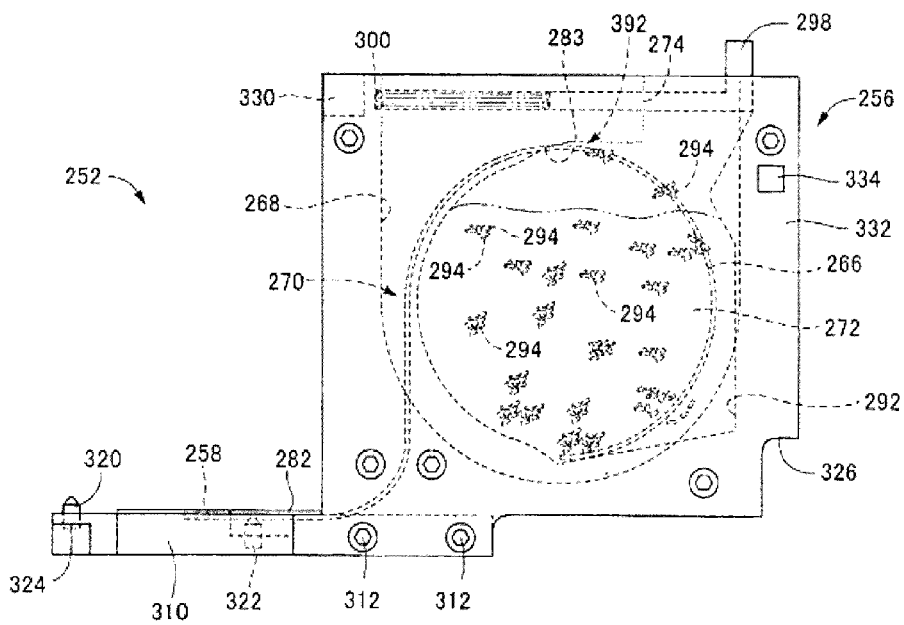
Figure 8:
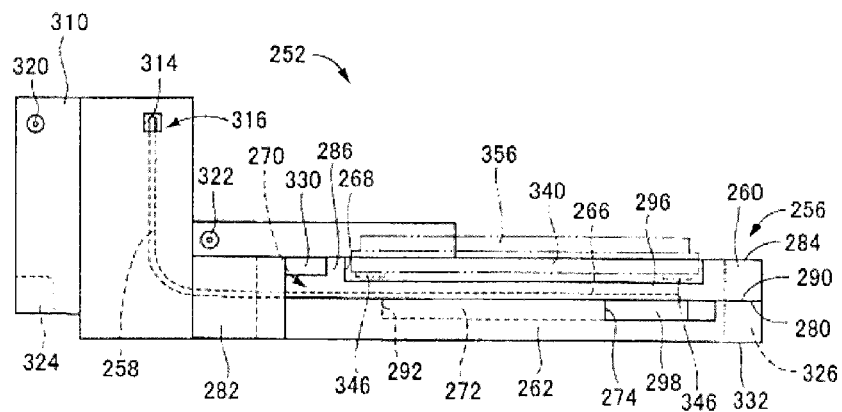

Component case 256, as shown in FIG. 7 and FIG. 8, includes case members 260 and 262 which are fixed fitting into each other, and is provided with guiding groove 266, concavity 268, guiding passage 270, housing chamber 272, and component inlet 274. Guiding groove 266 is formed into an annular section opened in opening surface 280 of case member 260 which faces case member 262; guiding passage 270 is formed from the covering by case member 262 and cover 282 of an annular section groove continuing from guiding groove 266 and a vertical groove. At the boundary section between guiding groove 266 and guiding passage 270 which is at the upper section housing chamber 272, drop-off section 283 is formed. Concavity 268 is formed opening between upper surface 286 and outside surface 284 which is the opposite surface to opening surface 280 of case member 260.

Housing chamber 272 is formed by the covering of concavity 292 which opens on the opening surface 290 of case member 262 by case member 260, and many components 294 are stored in a loosely packed state as bulk components. As component 294, leadless electronic circuit components which do not have leads are housed, for example, capacitors and resistors and the like, and components which have electrodes made from magnetic material (chip components) are housed. Housing chamber 272 and concavity 268 are divided by bottom wall section 296 of concavity 268. Component inlet 274 is provided at the upper section of case member 262, and components 294 enter through into housing chamber 272. Component inlet 274 opens and closes using shutter 298 which forms an opening/closing member. Shutter 298 is biased in the closed direction of component inlet 274 by compression coil spring 300.

Component passage 258, as shown in FIG. 7 and FIG. 8, is formed from block shaped passage forming body 310. Component case 256 is detachably fixed to passage forming body 310 by multiple bolts 312 which are a kind of fixing means, and after being fixed acts as an integrated passage-equipped component case 252. Component passage 258 is formed continuing from guiding passage 270, and in a state in which passage-equipped component case 252 is held on mounting head 25, the front end thereof has a shape which goes below suction nozzle 172 stopped at the component takeout position. Opening 314 is provided in the section corresponding to the front end of component passage 258 of passage forming body 310 such that takeout of components 294 is allowed, and the section including that opening 314 configures component supply section 316.

Protruding out on passage forming body 310 are multiple, for the present embodiment two, positioning pins 320 and 322. Positioning pins 320 and 322 are positioned differently in the X-axis direction and the Y-axis direction, and configure an installation positioning section provided vertically. Also on passage-equipped component case 252, in two locations separated in the front-rear direction thereof, downward facing engaging surfaces 324 and 326 are formed in each of the front section of passage forming body 310 and the rear section of case member 262 to configure a section to be engaged. In a state in which passage-equipped component case 252 is attached to head main body 180, the Y-axis direction is the front-rear direction, the component passage 258 side is the front side, and the component inlet 274 side is the rear side.

Further, on passage-equipped component case 252, RFID RF tag 330 is provided on outside surface 284 of case member 260. RF tag 330 is equipped with a communication section and a memory section; the type of component 294 stored in housing chamber 272 is memorized to form housed component type information holding section. Also, in surface 332 which is the opposite side to opening surface 290 of case member 262, two-dimensional code 334 is provided, and, for example, an identification number which forms identity information for identifying the type of component case 256 and the individual component case 256 is memorized.

Figure 9:
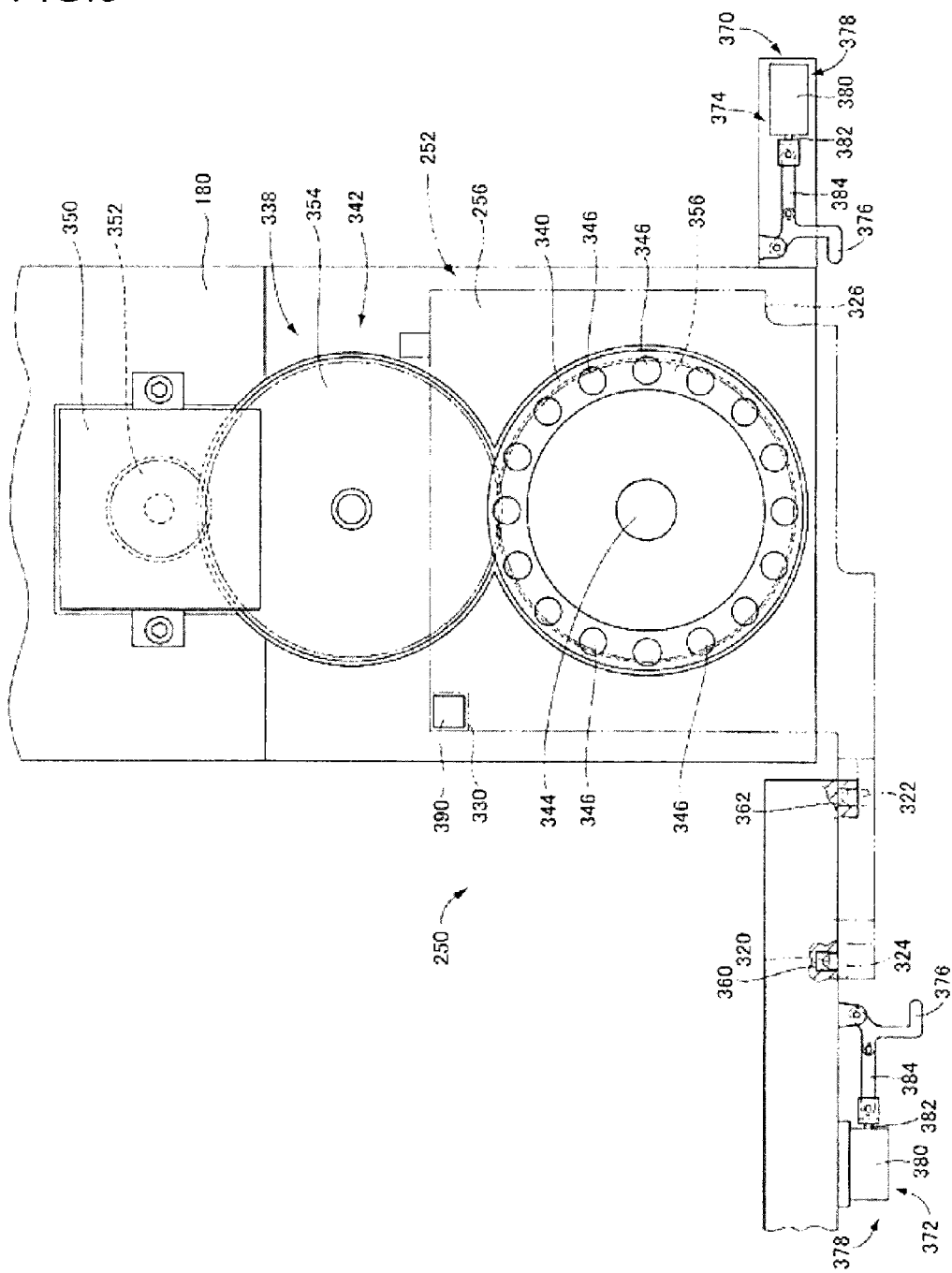

The bulk component transfer device 254 includes bulk component driving device 338. This bulk component driving device 338 is provided on head main body 180 of mounting head 25. This bulk component driving device 338, as shown in FIG. 9, includes rotating disk 340 and rotating disk driving device 342. Rotating disk 340 is formed in a disk shape and is attached rotatably around an axis line parallel to the X-axis direction to head main body 180 by axis 344. On the side of rotating disk 340, multiple, for example, three or more permanent magnets 346 which form magnets, are held on the circumference centered around the rotational axis line the side of rotating disk 340 separated by suitably spaced intervals, which for the present embodiment are equal angle intervals. Rotating disk driving device 342 has as a driving source electric motor 350 provided above rotating disk 340, and the rotation thereof is transmitted via gears 352 and 354 to gear 356 fixed concentrically to rotating disk 340, such that rotating disk 340 can be rotated in both the forward and reverse directions to any angle. Also on head main body 180, two positioning holes 360 and 362 are formed opening on lower surface of head main body 180. Electromagnets may be used instead of permanent magnets.

Further provided on head main body 180 is passage-equipped component case attachment device 370. Passage-equipped component case attachment device 370, in this embodiment, includes pair of clamping devices 372 and 374. These clamping devices 372 and 374 are provided separated in the Y-axis direction, and as shown by one of the clamping devices 372, include clamping claw 376 which forms a holding member and clamping claw driving device 378 which forms a holding member driving device.

Clamping claw 376 is attached rotatably around an axis line parallel to the X-axis direction to head main body 180. Air cylinder 380 which forms the driving source of clamping claw driving device 378 is fixed to head main body 180, and one end of piston rod 382 of air cylinder 380 is linked to the other end of link 384 which is connected as to be relatively rotatable so that clamping claw 376 is relatively rotatable. By the expansion/contraction of piston rod 382: clamping claw 376 is moved to a clamp position in which clamping claw 376 engages with engaging surface 324 and holds passage-equipped component case 252 from below, as shown in FIG. 10; and clamping claw 376 is moved to an unclamp position in which clamping claw 376 separates from engaging surface 324, and as well as releasing passage-equipped component case 252, is retracted outside from the space under passage-equipped component case 252, as shown in FIG. 9.

Figure 15:
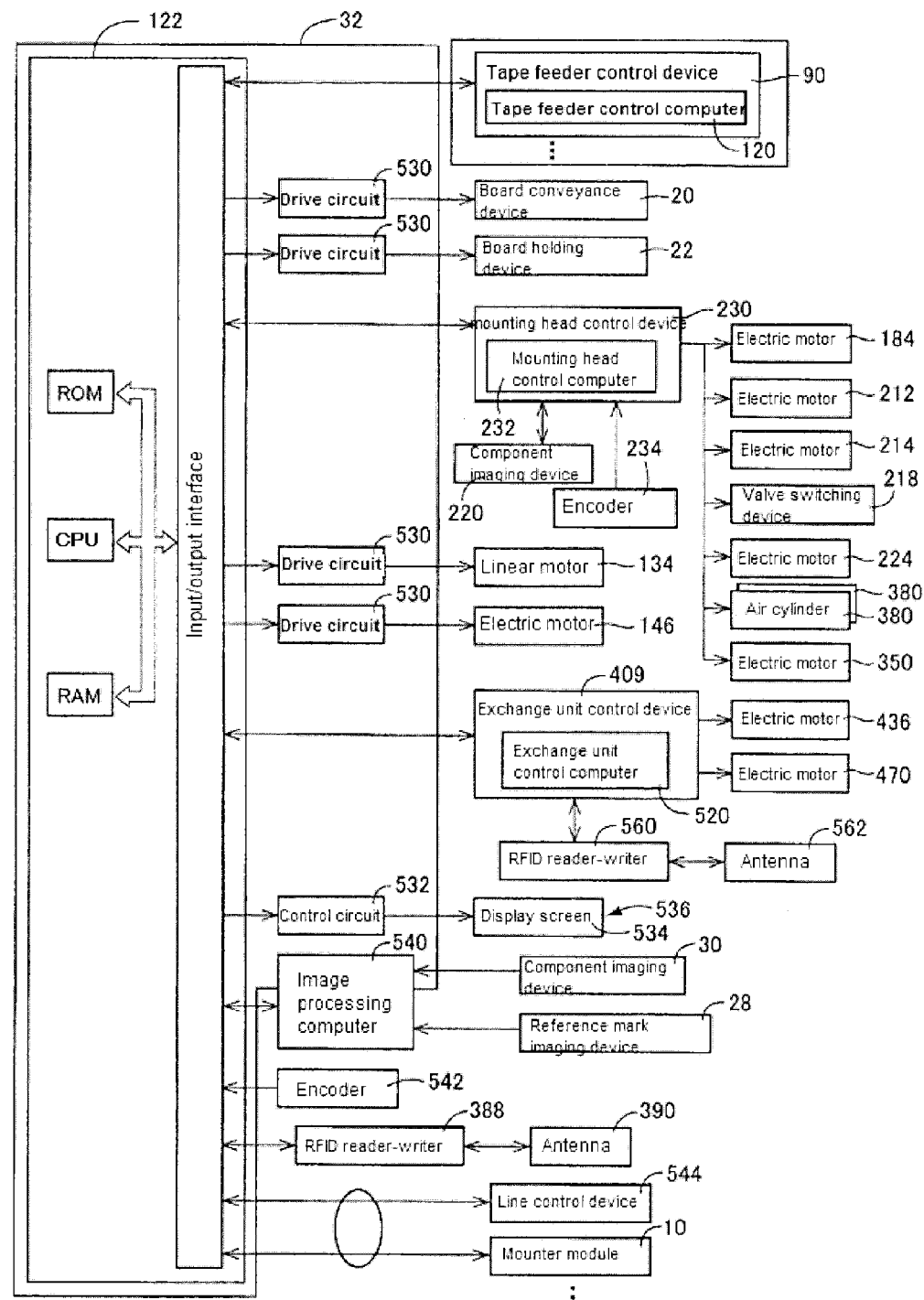

Further, antenna 390 of RFID reader-writer 388 which forms an information acquisition device is provided on head main body 180. RFID reader-writer 388, as shown in FIG. 15, is equipped with separated type antenna 390, and that antenna 390 is provided on head main body 180, and is connected to the main body section of RFID reader-writer 388 by a connector and cord provided on mounting head 25.

Figure 10:
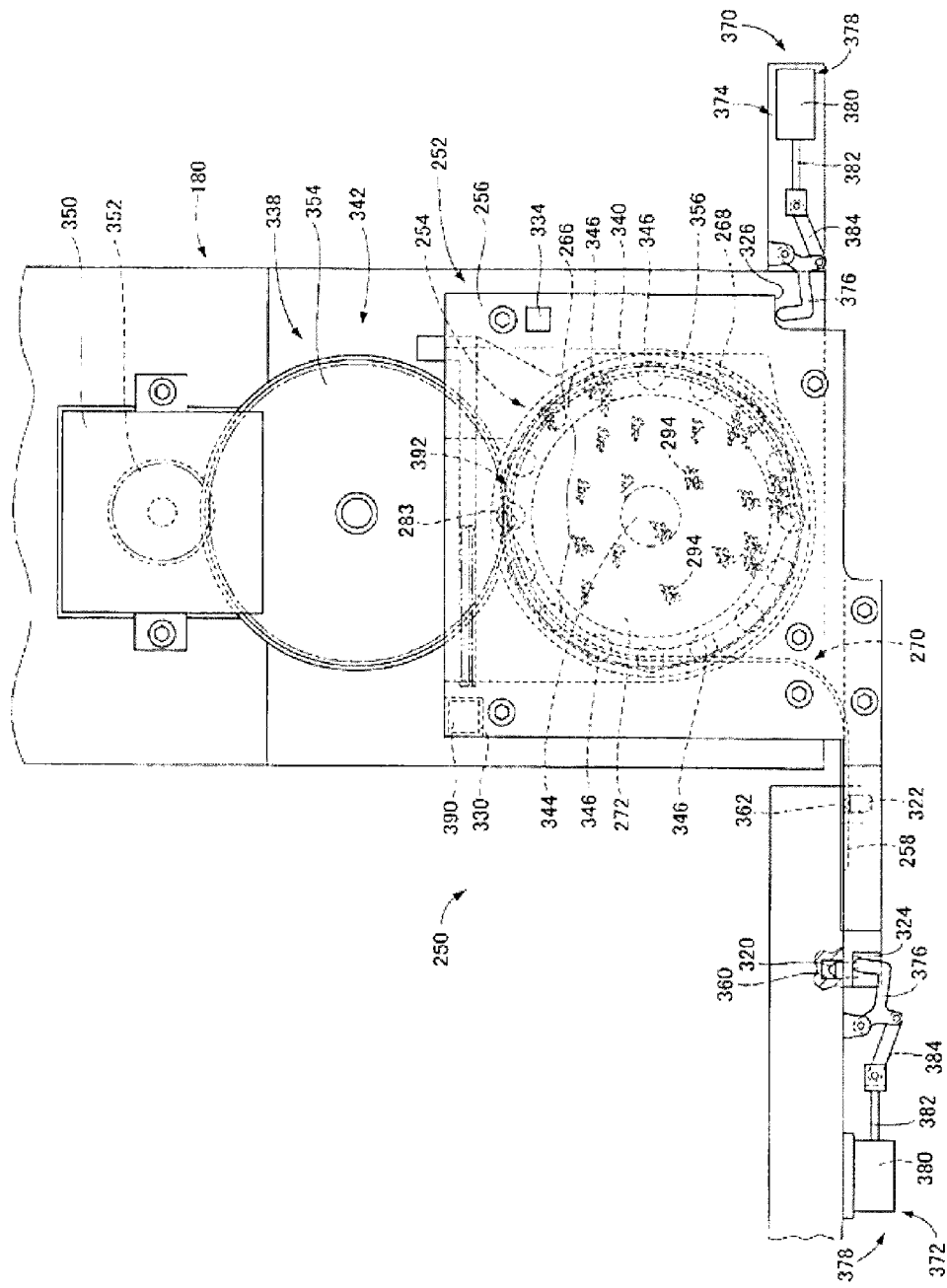

For passage-equipped component case 252, as shown in FIG. 10, positioning pins 320 and 322 are engaged with positioning holes 360 and 362 and positioned horizontally with respect to head main body 180. And, by each clamping claw 376 of clamping devices 372 and 374 being engaged with engaging surface surfaces 324 and 326, passage forming body 310 is contacted against head main body 180, such that passage-equipped component case 252 is held positioned vertically with respect to head main body 180. In that state, rotating disk 340 is engaged in concavity 268, and the state is such that the center of a circle defined by the arc of guiding groove 266 matches the rotational axis line of rotating disk 340. Due to this, in accordance with permanent magnets 346 being rotated by the rotation of rotating disk 340, as well as components 294 inside housing chamber 272 being picked up and moved from down to up by permanent magnets 346, a portion of components 294 are fitted into guiding groove 266, and enter into guiding passage 270 from guiding groove 266. However, it is not the case that all of the components 294 moved in accordance with the rotation of permanent magnets 346 can be fitted into guiding groove 266, and components 294 which are moved to near the boundary between guiding groove 266 and guiding passage 270 without being fitted into guiding groove 266 are dropped off by drop-off section 283 and fall into housing chamber 272. Meanwhile, components 294 which entered into guiding passage 270 soon enter into component passage 258, and move to component supply section 316 in a state arranged in a line. Although omitted from the figures, the air inside component passage 258 is sucked by an air suction device to aid the movement of component 294 to component supply section 316.

As is clear from the above descriptions, bulk component arranging device 392 which sorts, arranges in a line, and makes enter into guiding passage 270 components 294 is configured from guiding groove 266 and drop-off section 283, and in the present embodiment, this arranging device 392 configures bulk component transfer device 254 which acts together with the bulk component driving device 338 configured from the above rotating disk 340 and rotating disk driving device 342 to transfer components 294 to component passage 258 via guiding passage 270. Also, in the present embodiment, as well as passage-equipped component case 252 being able to be separated from bulk component driving device 338, it is attached such that it can be attached/removed to/from head main body 180 by passage-equipped component case attachment device 370, such that exchange is possible, with passage-equipped component case 252 being removed from head main body 180 and a different passage-equipped component case 252 being attached.

With passage-equipped component case 252 in a clamped state as above, RF tag 330 of passage-equipped component case 252 can perform communication with RFID reader-writer 388 via antenna 390 fixed on head main body 180. By passage-equipped component case 252 being released by clamping devices 372 and 374 and moved down with respect to head main body 180, positioning pins 320 and 322 are removed from positioning holes 360 and 362. Also, rotating disk 340 is removed from concavity 268 and passage-equipped component case 252 can be removed from head main body 180 with all of bulk component driving device 338 remaining on head main body 180 and in a state held as is on mounting head 25.

Figure 11:
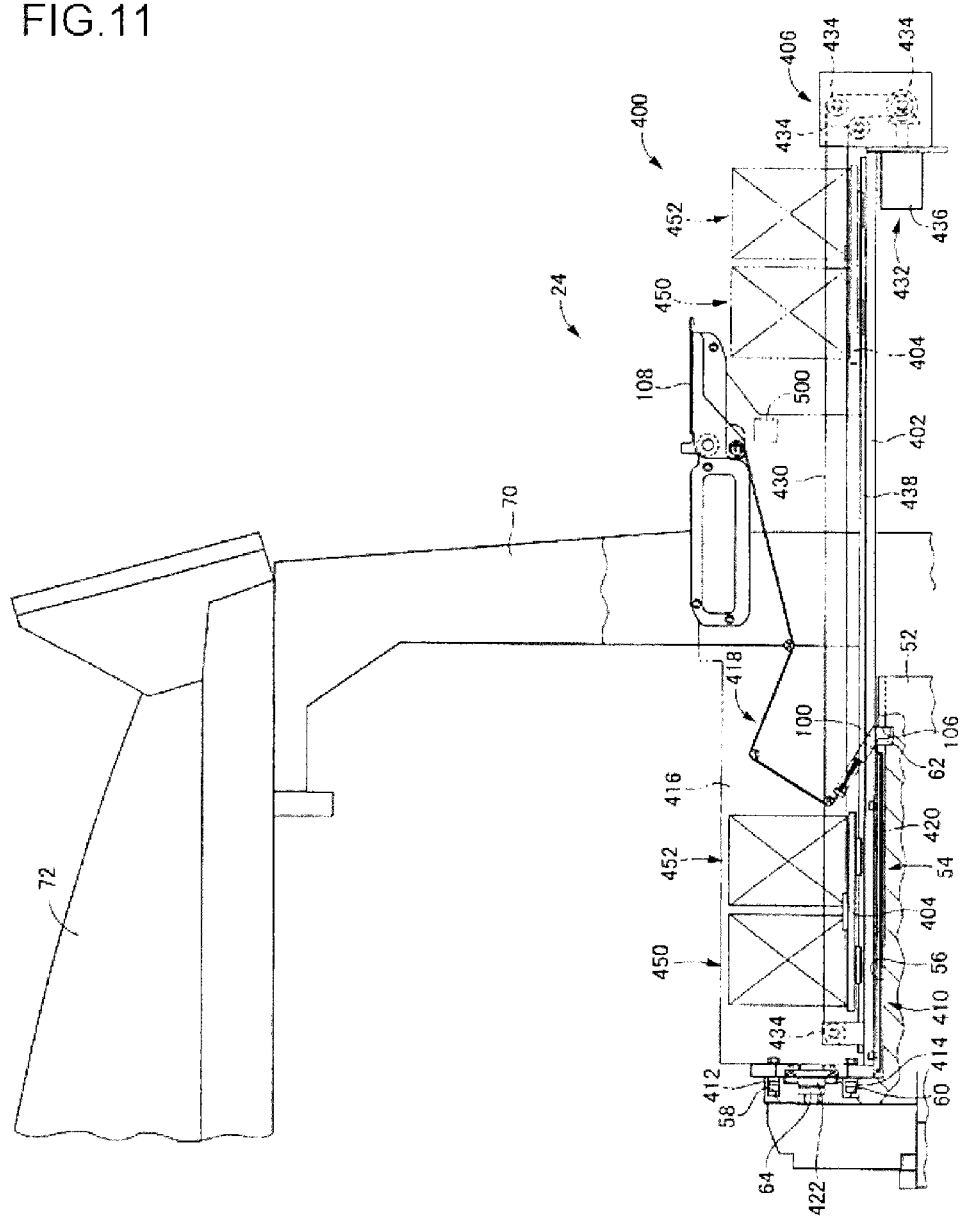

This bulk component supply system 24 also includes passage-equipped component case exchange unit 400 (hereafter abbreviated to exchange unit 400) which forms a bulk component case exchange unit. This exchange unit 400, as shown in FIG. 11, includes: exchange device main body 402; slide 404 acting as a moving member which forms a movable member; slide driving device 406 which forms a movable member driving device and passage-equipped component case exchange device 408 (refer to FIG. 13) which forms bulk component case exchange device; and exchange unit control device 409 (refer to FIG. 15); and in this component mounter device is attached to the above component supply table 52.

Exchange device main body 402 is attached to component supply table 52 by passage-equipped component case exchange unit attachment device 410 which forms a bulk component case exchange unit attachment device. Passage-equipped component case exchange unit attachment device 410 has the same configuration as the above tape feeder attachment device 116, and includes: positioning pins 412 and 414 provided on the front of the front end which is an end on the lengthwise direction of exchange device main body 402; engaging device 418 provided on side plate 416 of exchange device main body 402 and rail 420 provided on the lower surface of exchange device main body 402; and is fixed to component supply table 52 by being attached to any one of the multiple installation sections 54. By releasing the engagement by engaging device 418, exchange unit 400 can be removed from component supply table 52 attached to module main body 18, such that exchange unit 400 can be attached/removed to/from module main body 18. Connector 422 is also provided on the front of exchange device main body 402 and is connected to connector 64. For the exchange unit 400 attached to component supply table 52, the front thereof is positioned inside a space inside the module; the rear thereof protrudes from the front of mounter module 10.

Slide driving device 406, in the present embodiment, includes endless belt 430 and belt moving device 432. Belt 430, as well as being wound around multiple pulleys 434, is engaged with slide 404, and belt 430 is moved by one of the multiple pulleys 434 being rotated by electric motor 436, such that slide 404 is moved in the Y-axis direction while being guided along guide rail 438 which forms a guiding member attached to exchange device main body 402. Multiple pulleys 434 and electric motor 436 and so on configure belt moving device 432.

Figure 12:
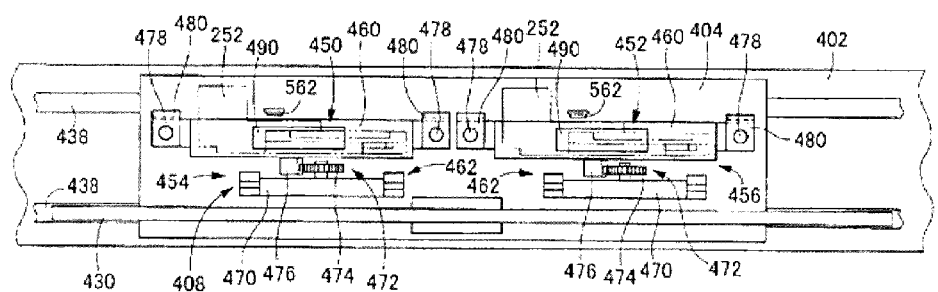
Figure 13:
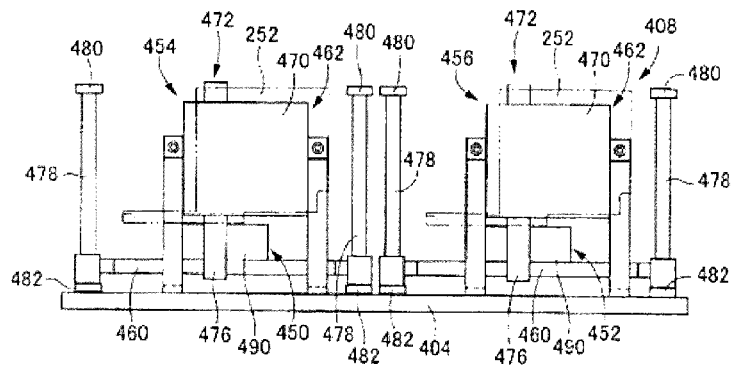

Slide 404 is equipped with case holding sections 450 and 452. Passage-equipped component case exchange device 408, as shown in FIG. 12 and FIG. 13, includes case holding section raising/lowering devices 454 and 456 which for case holding section driving devices for raising/lowering respectively case holding sections 450 and 452. Raising/lowering devices 454 and 456 are provided lined up in a direction parallel to the moving direction of slide 404; the configuration is the same so one of the raising/lowering devices 454 is described.

Figure 14:
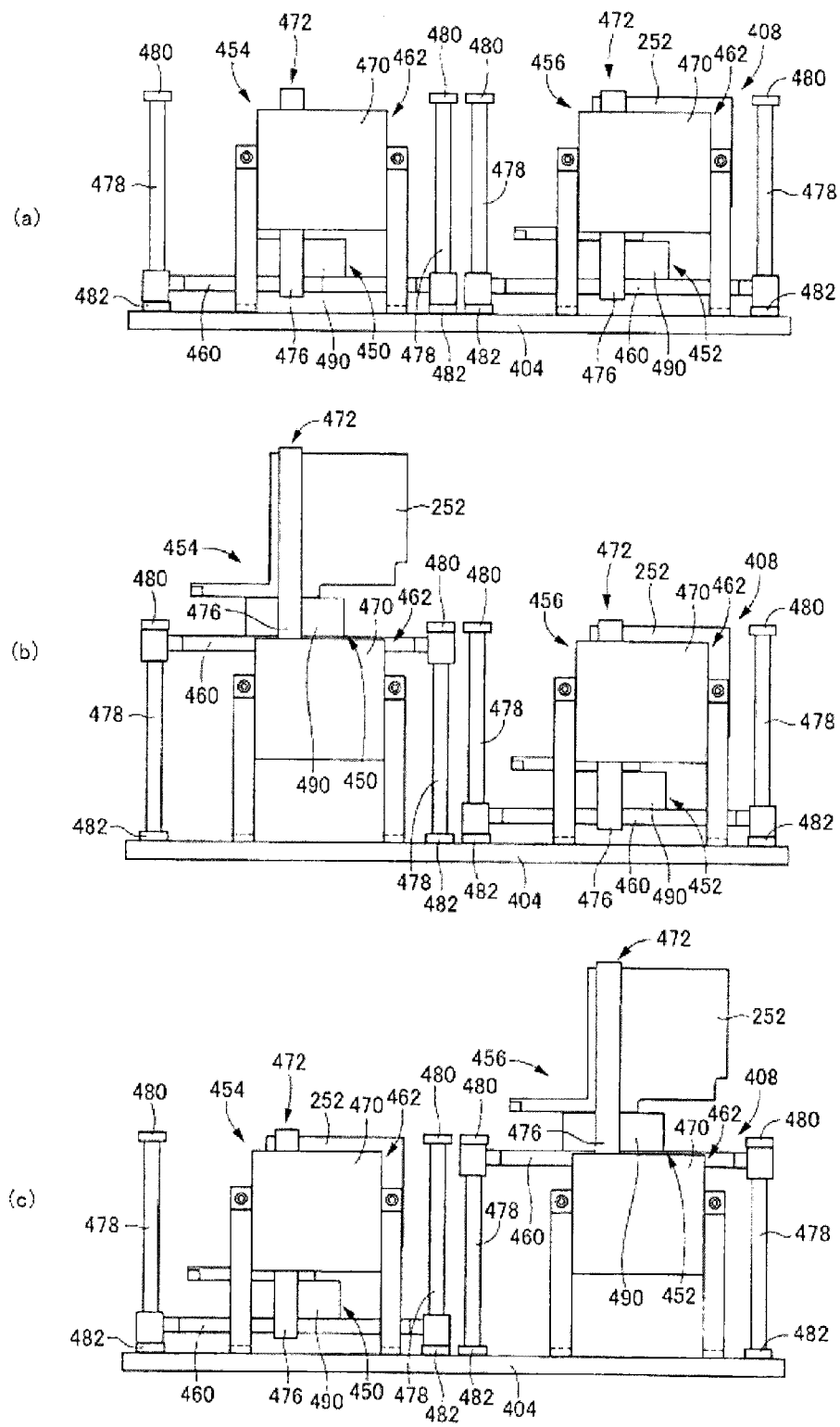

Case holding section raising/lowering device 454 includes raising/lowering member 460 which forms a moving member and raising/lowering member driving device 462 which forms a moving member driving member. Raising/lowering member driving device 462 includes electric motor 470 which forms a driving source, and movement conversion mechanism 472 for converting the rotation of electric motor 470 into linear movement. Movement conversion mechanism 472, in the present embodiment, includes: pinion 474 which is rotated by electric motor 470; and rack 476 which is fixed in the vertical direction to raising/lowering member 460 and is engaged with pinion 474; and rack 476 is raised/lowered by pinion 474 being rotated and, as shown in FIG. 14, raising/lowering member 460 is raised/lowered between an upper limit position and lower limit position while being guided by pair of guide rods 478 which form a guiding member. The raising/lowering limit positions of raising/lowering member 460 are defined by raising/lowering member 460 contacting stoppers 480 and 482 which are larger than guide rod 478 provided respectively at the ends of guide rod 478.

Case holding section 450 is provided on raising/lowering member 460, and case holding sections 450 and 452 are provided on slide 404 lined up in a direction parallel to the moving direction by the movement of slide 404. In the present embodiment, case holding section 450 includes: holding platform 490 on which passage-equipped component case 252 is loaded, and case positioning holding device (omitted from the figures); and detachably holds passage-equipped component case 252. The case positioning holding device, as well as positioning passage-equipped component case 252 in a horizontal direction, holds it with sufficient holding force, and is an item for which the holding is released by moving component case holding section 450 down with respect to passage-equipped component case 252 against the holding force.

Slide 404 is moved between a forward limit position and a rear limit position by slide driving device 406. The forward limit position, as shown by solid lines in FIG. 11, is the position at which case holding sections 450 and 452 are positioned at the front of exchange unit 400; the rear limit position, as shown by two-dash lines, is the position at which case holding sections 450 and 452 are positioned at the rear of exchange unit 400. In this mounter module 10 which includes exchange unit 400, the head moving region is a region in which mounting head 25 moves to case holding sections 450 and 452 of slide 404 which is moved to the forward limit position, with transferring of passage-equipped component case 252 able to be performed between those two case holding sections. It follows that, the rear limit position is the first position at which the two case holding sections 450 and 452 are positioned outside the head moving region; and the forward limit position is the second position at which the two case holding sections 450 and 452 are positioned inside the head moving region. Also, the region at which the front end of exchange unit 400 is positioned is the bulk component case exchange region at which exchange of passage-equipped component cases 252 is performed; the region at which the rear is positioned is the bulk component replenishment region at which replenishment of components 294 to bulk component case 256 is performed; and slide 404 is moved to the bulk component replenishment region and the bulk component case exchange region by slide driving device 406. In the present embodiment, the bulk component replenishment region is provided outside the head moving region and is provided outside mounter module 10. The forward limit position and rear limit position of slide 404 are respectively defined by stoppers which are omitted from the figures, and electric motor 436, in the present embodiment, does not have a stopping position control function.

Further, two-dimensional code 500 is provided on exchange unit 400 and configures an exchange unit information holding section. On two-dimensional code 500, for example, an identification number which forms identity information for identifying individual exchange units 400 is memorized, and is provided, for example, on side plate 416 of exchange device main body 402.

Exchange unit control device 409 is configured from exchange unit control computer 520 (refer to FIG. 15) as the main part, and controls electric motor 436 and so on. Computer 520 communicates with and is connected to module control computer 122 by connectors 422 and 64. Electric power supply is also performed via connectors 422 and 64.

Module control device 32 controls items such as various driving sources which configure mounter module 10 and linear motor 134 and so on via drive circuit 530, and controls display screen 534 via control circuit 532. Display device 536 which forms a reporting device is configured from control circuit 532 and display screen 534, and various information and so on is displayed via characters and diagrams and so on. For the reporting device, devices which report information and so on in various forms can be used such as lighting of lamps, flashing, sounding of a buzzer, announcements via recorded voice, and communication to a mobile terminal which an operator has.

Connected to the input/output interface of module control computer 122 are image processing computer 540 which processes data acquired from the images of reference mark imaging device 28 and component imaging device 30, encoder 542 (one is shown as a representative in FIG. 15) provided on items such as electric motor 146 of X-axis slide moving device 144, RFID reader-writer 388, tape feeder control computer 120, mounting head control computer 232 and exchange unit control computer 520, and so on. Note that, image data of component imaging device 220 of mounting head 25 is sent from mounting head control device 230 to image processing computer 540 via module control computer 122 and processed. And, required data is sent from module control computer 122 to mounting head control computer 232.

Also connected to input/output interface via a communication cable are module control device 32 of other mounter modules 10 and line control device 544 which controls overall the entire mounting line. Line control device 544 is configured from a host computer as the main part. Further, memorized on the RAM of module control computer 122 are various programs and data and so on for the mounting of electronic circuit components on circuit board 40.

In the mounter module 10 configured as above, as a form of mounting electronic circuit components on circuit board 40, mounting head 25 takes out electronic circuit components from both tape feeder 50 and bulk component supply device 50 and mounts them onto one circuit board 40. For this, passage-equipped component case 252 is held on mounting head 25 and tape feeder 50 and exchange unit 400 are attached to component supply table 52. This passage-equipped component case 252 is referred to as leading passage-equipped component case 252. Mounting head 25 is moved to tape feeder 50 by head moving device 26 when removing electronic circuit components from tape feeder 50; suction nozzle 172 is moved to the takeout mounting position by the rotation of rotating body 182 and then lowered to take out an electronic circuit component from tape feeder 50. Bulk component supply device 250 supplies components 294 while being moved together with mounting head 25; suction nozzle 172 which has reached the component takeout position by the rotation of rotating body 182 is lowered and component 294 is taken out from component supply section 316. In tape feeder 50, taped components 78 are transferred by transfer device 82 so that electronic circuit components are sent to component supply section 94; in bulk component supply device 250, components 294 are moved to component supply section 316 by the operation of bulk component driving device 338 and an air suction device; and each is put on standby for being taken out. Suction nozzle 172 holding an electronic circuit component is moved consecutively to a component imaging position and a mounting position, and after capturing an image of the holding orientation of the electronic circuit component, component 294 is lowered at the mounting position and mounted on circuit board 40. The attachment of an electronic circuit component to circuit board 40 by mounting head 25 is disclosed in the specifications of Japanese Patent Application 2011-206452, so detailed descriptions are omitted here.

If components 294 to be supplied run out in leading passage-equipped component case 252, leading passage-equipped component case 252 is exchanged with following passage-equipped component case 252 which is a different passage-equipped component case 252 to leading passage-equipped component case 252 and which is a passage-equipped component case 252 in which are stored components 294 to be supplied of the same type as those in leading passage-equipped component case 252. Following passage-equipped component case 252 is held by one of the two case holding sections 450 and 452 of exchange unit 400, and the other case holding unit is empty and does not hold a passage-equipped component case 252.

During exchange, slide 404 is positioned at the forward limit position which is in the bulk component case exchange region, and leading passage-equipped component case 252 is moved by mounting head 25 onto an empty case holding section, which in the example shown in FIG. 14 (a) is the front side case holding section 450. Here, raising/lowering member 460 is positioned at the lower limit position, and case holding section 450 is positioned at a retract position. Mounting head 25 is moved to a predetermined case transfer position with respect to empty case holding section 450. This position is a position at which leading passage-equipped component case 252 is held by case holding section 450 in a state positioned at a position specified in the X-axis direction and Y-axis direction.

After the movement of leading passage-equipped component case 252, as shown in FIG. 14 (b), raising/lowering member 460 is raised to the upper limit position, and case holding section 450 is raised to the case transfer position. This position is the position at which leading passage-equipped component case 252 is placed onto case holding platform 490, and leading passage-equipped component case 252 is held by a case positioning holding device. After holding, the clamping of leading passage-equipped component case 252 by clamping devices 372 and 374 is released, and then case holding section 450 is lowered to the retract position. By this, positioning pins 320 and 322 are removed from positioning holes 360 and 362, concavity 268 is separated from rotating disk 340, and leading passage-equipped component case 252 is removed from mounting head 25 with all of bulk component driving device 338 being held as is on mounting head 25. Bulk component arranging device 392 configured from guiding groove 266 and drop-off section 283 is in leading passage-equipped component case 252 and is removed from mounting head 25 together with leading passage-equipped component case 252.

After the removal of leading passage-equipped component case 252, mounting head 25 moves following passage-equipped component case 252 to a case transfer position specified in advance with respect to a case holding section, here case holding section 452. After movement, as shown in FIG. 14 (c), raising/lowering member 460 is raised to the upper limit position, and case holding section 452 holding following passage-equipped component case 252 is raised to the case transfer position. By this, as well as concavity 268 of following passage-equipped component case 252 being engaged with rotating disk 340, and positioning pins 320 and 322 being engaged with positioning holes 360 and 362, the section surrounding positioning pins 320 and 322 of passage forming body 310 are contacted against the lower surface of head main body 180. After the raising of case holding section 452, clamping claw 376 is rotated to the clamp position, and as well as leading passage-equipped component case 252 being held by mounting head 25 in a state positioned in a vertical direction and a horizontal direction, the state becomes such that moving force can be applied to components 294 inside housing chamber 272 in the direction of component passage 258 by bulk component driving device 338.

After following passage-equipped component case 252 is held by mounting head 25 and has become leading passage-equipped component case 252, case holding section 452 which was holding that passage-equipped component case 252 is lowered to the retract position and becomes an empty case holding section 452. Then, mounting head 25 recommences mounting onto circuit board 40 components 294 supplied from the new leading passage-equipped component case 252.

Meanwhile, on exchange unit 400, slide 404 is moved to the rear limit position and is positioned in the bulk component replenishment region. The fact that leading passage-equipped component case 252 is empty, and the type of components 294 to be supplied by leading passage-equipped component case 252, are displayed on display screen 534, and based on this an operator inserts components 294 into housing chamber 272 of the leading passage-equipped component case 252 which has become empty which case holding section 450 is holding, to make that following passage-equipped component case 252. Because the bulk component replenishment region is outside the head moving region and is outside module main body 18, an operator can perform work in a spacious location at the same time as component mounting work is performed by mounting head 25. When exchange of leading passage-equipped component case 252 and following passage-equipped component case 252 is performed next time, empty case holding section 452 receives leading passage-equipped component case 252, and case holding section 450 delivers following passage-equipped component case 252 to mounting head 25. Case holding sections 450 and 452 alternately become the leading passage-equipped component case holding section and the following passage-equipped component case holding section.

An operator can also exchange a passage-equipped component case 252 held in one of the case holding sections 450 and 452 with a spare passage-equipped component case 252. Spare passage-equipped component case 252 is a passage-equipped component case 252 different to the two passage-equipped component cases 252 being used currently for supply of components, for example it may be a passage-equipped component case 252 for which housing of components of the same type as the components currently being supplied was performed at a location different to mounter module 10, or it may be a passage-equipped component case 252 in which are housed components of a different type to those in the above two passage-equipped component cases 252. By this exchanging, for example, in the former case, replenishment or replacement of a leading passage-equipped component case 252 for which an error has occurred and for which supply has become impossible to a correct passage-equipped component case 252 is performed; or in the latter case, change of supplied components is performed. The bulk component replenishment region is also the target component case work region.

During the above exchange of the leading passage-equipped component case 252 with the following passage-equipped component case 252, information is passed between module control computer 122, mounting head control computer 232 and exchange unit control computer 520, such that the raising and so on of case holding section 450 and 452 is performed at the specified timing. This passing of information may be performed by various methods, one of which is as follows. First, by module control computer 122, based on the program corresponding to the type of electronic circuit which should be assembled, the type of electronic circuit components which should be supplied from component supply devices 23 and 24, and the installation sections 54 on component supply table 52 of tape feeders 50 and exchange unit 400 used to supply those electronic circuit components are decided and displayed on display screen 534.

According to that display, an operator attaches exchange unit 400 and tape feeders 50 to each of the multiple installation sections 54 on component supply table 52. Tape feeders 50 and exchange unit 400 are respectively equipped with tape feeder control computer 120 and exchange unit control computer 520, and connector 118 and connector 422; and if tape feeder 50 or exchange unit 400 is attached to component supply table 52, connectors 118 or 422 are connected to connector 64 of component supply table 52, and as well as the position of that connector 64 being identified by module control computer 122, information is sent to module control computer 122 via that connector 64. Respectively sent are: from tape feeder control computer 120, the type of taped component 78 and tape feeder information by which tape feeder 50 can be individually identified; and from exchange unit control computer 520, the type of component 294 supplied by passage-equipped component case 252 which is held by case holding sections 450 and 452 and unit information by which exchange unit 400 can be individually identified. Before tape feeder 50 is attached to component supply table 52, taped components 78 are set, and when that is done, information on the type of electronic circuit components of taped components 78 is read by the information reading device from an information memory section attached to component holding tape 76, and then memorized in the memory of tape feeder control computer 120. This information is sent together with the tape feeder information.

With regard to exchange unit 400, RFID reader-writer 560 (refer to FIG. 15) is provided on exchange device main body 402, and separated type antenna 562 of that is provided on slide 404 corresponding to each case holding section 450 and 452 (refer to FIG. 12). Antenna 562 is connected by a cord to the main body section of RFID reader-writer, and RFID reader-writer is connected to exchange unit control computer 520. By this, with passage-equipped component case 252 in a state held in case holding section 450 and 452, housed component type information memorized in the memory section of RF tag 330 is read by RFID reader-writer 560 via antenna 562 and then memorized on the memory of exchange unit control computer 520. This information is sent together with the unit information.

Based on information sent like this and information of the position of installation sections 54 to which are attached tape feeder 50 and exchange unit 400, it is judged whether for tape feeder 50 and exchange unit 400 respectively the planned type of electronic circuit components are to be supplied from the planned installation sections 54; if the judgment result is that any of the types of electronic circuit components and installation section 54 positions are not as planned, this fact is displayed on display screen 534. Along with this, if a tape feeder 50 was not as planned, mounter module 10 is turned to a state in which component mounting operation is prohibited; if an exchange unit 400 was not as planned, mounting head 25 and exchange unit 400 are turned to a state in which exchange operation of passage-equipped component case 252 is prohibited. If the type of component supplied by passage-equipped component case 252 held by exchange unit 400 is different to the planned type, that fact is known before passage-equipped component case 252 is attached to mounting head 25, and it can be prevented that mounting head 25 and exchange unit 400 perform transfer operation of a passage-equipped component case 252 with a component type different to that planned. Change of installation section 54 position, or passage-equipped component case 252, or tape feeder 50 is performed according to the above display, and if the mistake is corrected, the state in which component mounting operation is prohibited, or the state in which exchange is prohibited, is cleared.

Further with regard to passage-equipped component case 252, as above, when passage-equipped component case 252 is attached to mounting head 25 by exchange unit 400, the housed component type information memorized in the memory section of RF tag 330 of that passage-equipped component case 252 is read by RFID reader-writer 388 via antenna 390, and based on that read information, it is judged whether the planned type of component 294 is being supplied, so that it is re-checked whether type of component 294 supplied by passage-equipped component case 252 attached to mounting head 25 is as planned. If the judgment result is that the type of component 294 is not as planned, as well as that fact being displayed on display screen 534, mounter module 10 is turned to a state in which component mounting operation is prohibited. Change of passage-equipped component case 252 is performed according to the above display, and if the mistake is corrected, the state in which operation is prohibited is cleared.

This kind of checking of the type of component 294 in passage-equipped component case 252 attached to mounting head 25 is especially useful when attachment/removal to/from the mounting head is being performed manually by an operator.

Also, due to the connecting of connectors 118 and 422 to connector 64, and the sending of feeder information, taped component type information, unit information, and housed component type information; by module control computer 122, the attachment position of tape feeders 50 and exchange unit 400 on component supply table 52 can be identified, and the type of components to be supplied can be acquired, and by this, after the attachment of tape feeders 50 and exchange unit 400 to any of the multiple installation sections 54 on component supply table 52, based on the identification of the above positions and the acquisition of the supplied component types, mounting head 25 can be moved to tape feeder 50 and take out electronic circuit components, or can move to exchange unit 400 and perform exchange of passage-equipped component cases.

Multiple exchange units 400 may be attached to component supply table 52. In that case, the types of the components supplied by passage-equipped component cases 252 which are exchanged by each of the multiple exchange units 400 may be the same or may be different.

Note that, the above tape feeder information and unit information which make it possible to individually identify tape feeders 50 and exchange units 400 is used by module control computer 122 to identify tape feeders 50 and exchange unit 400 and perform control related to those items. For example, the information is used to manage the remaining component quantity of taped components 78 and passage-equipped component case 252 attached to them and for information management of operational defects of them. Also, in the present embodiment, when components 294 are inserted into passage-equipped component case 252, two-dimensional code 344 provided on passage-equipped component case 252 is read together with a two-dimensional code holding information regarding component 294 such as the chip component type, specifications, quantity, and so on provided in the packaging of that component; and then is memorized in the memory section of RF tag 330. However, this is not essential. If the type of components 294 housed in passage-equipped component case 252 is decided as one type, information regarding that one type of chip component may be memorized in advance in the memorizing section of RF tag 330.

To add further, the leading component case holding section and following component case holding section of the movable member may be provided lined up in a direction intersecting the movement direction of the movable member.

Also, multiple different types of component cases may be set on one exchange unit. For example, multiple sets of movable member, movable member driving device, and bulk component case exchange device may be set on one exchange device main body, and the types of components to be supplied by component cases exchanged by each set may be different.

Or, two component cases which supply different types of bulk components may be held on the two case holding sections of the movable member of the exchange unit. For example, when mounting two types of bulk components onto one circuit board, the two component cases housing each of those two types of bulk components are held in two case holding sections, and each time the type of bulk component to be mounted on the circuit board changes, exchange of the component cases between the mounting head and the exchange unit is performed. Or, when the type of circuit board changes and the type of bulk components to be mounted changes, an operator exchanges the component case supplying the bulk components to be mounted on the circuit board before the type change, which is the component case which one of the two case holding sections is holding, to a component case housing the type of bulk components to be mounted on the circuit board after the type change, and if the component case currently being held on the mounting head is exchanged with the component case to be used next and is held by the case holding section, an operator exchanges that component case too with the component case to be used next. In this case, by the process of changing two component cases according to changes in the type of circuit boards, a state arises in which two component cases which supply bulk components of different types are held on the mounting head and exchange unit. Note that, the case holding sections of the movable member are not restricted to two, there may be three or more, and the types of bulk components supplied by component cases held by those multiple case holding sections may be the same or may be different.

Also, in the above present embodiment, exchange of the leading component case and following component case is performed automatically by the bulk component case exchange unit, but this is not essential. For example, a collecting section for collecting a leading component case may be provided inside the head moving region, the mounting head be moved to the collecting section, the leading component case ejected, and an operator may attach a following component case to the mounting head; or a following bulk component case holding device may be provided inside the head moving region such that the following component case is transferred to the mounting head. A leading component case may be removed from the mounting head by an operator.

A following component case may be moved from outside the head moving region to inside the head moving region by a bulk component case moving device. If a following bulk component case holding device is provided inside the head moving region, the following component case is to be carried to that holding device; if a following bulk component case holding device is provided outside the head moving region, the following component case is to be carried inside the head moving region from the following bulk component case holding device; if a following bulk component case holding device is not provided, the following component case is to be carried to the position to be held by a mounting head inside the head moving region.

If ejection of a leading component case by the mounting head and holding of a following component case are performed separately, the following component case can be automatically mounted onto the mounting head by the bulk component case mounting device. It is desirable to make the bulk component case mounting device bulk component case exchanging device which exchanges the leading component case with the following component case, but this is not essential. For example, when ejecting a leading component case to a collecting section as above, it is not required to make it an exchange device, and a leading component case mounting device which mounts a leading component case, and a following component case removal device which removes a following component case, may be provided separately.

REFERENCE SIGNS LIST

25: Mounting head
26: Head moving device
250: Bulk component supply device
252: Passage-equipped component case
254: Bulk component transfer device
256: Component case
258: Component passage
400: Passage-equipped component case exchange unit

The invention claimed is:
1. A component mounter device comprising:
a bulk component supply device which is moved together with a mounting head for mounting electronic circuit components on a circuit substrate, the bulk component supply device comprising:
a bulk component case which houses electronic circuit components in a loosely packed and non-aligned state as bulk components;
a component passage which arranges bulk components in a line and guides the bulk components to a component supply section; and
a bulk component transfer device which transfers bulk components from the bulk component case to the component passage and which is equipped with a bulk component driving device which applies moving force in a direction of the component passage to bulk components in the non-aligned state inside the bulk component case so that the bulk components enter the component passage, and are arranged in a line from the non-aligned state,
wherein the bulk component case and the component passage are fixed to each other to configure a passage-equipped component case, and
wherein a leading passage-equipped component case, which is the passage-equipped component case which is moved together with the mounting head, and a following passage-equipped component case, which is a separate passage-equipped component case to the leading passage-equipped component case, are exchangeable with at least a driving source of the bulk component driving device being held on the mounting head;
a movable mounting head which holds that bulk component supply device and a suction nozzle which picks up and takes out bulk components from the component supply section of the component passage;
a substrate holding device which holds a circuit substrate;
a head moving device which imparts movement on the mounting head as is required for mounting of bulk components to the circuit substrate;
a movable member equipped with two case holding sections which detachably hold respective passage-equipped component cases, the movable member moving the two case holding sections to a first position positioned outside a head moving region which is a region where the mounting head is moved by the head moving device and a second position positioned inside the head moving region;
a movable member driving device for moving the movable member to the first position and the second position; and
a passage-equipped component case exchange device,
wherein one of the two case holding sections receives the leading passage-equipped component case from the mounting head, and the other case holding section delivers the following passage-equipped component case to the mounting head,
wherein the movable member, the movable member driving device, and the passage-equipped component case exchange device are supported integrally on an exchange device main body to configure a passage-equipped component case exchange unit,
wherein the component mounter device mounts on the circuit substrate held by the substrate holding device the electronic circuit components supplied from both the passage-equipped component case exchange unit and arranged-component feeders which hold multiple of the same type of electronic circuit components in an arranged state and supply from a component supply section arranged components which are the electronic circuit components in the arranged state consecutively one by one, wherein the component mounter device includes a component supply table to which the passage-equipped component case exchange unit and the arranged-component feeders are attachable, wherein the component supply table is equipped with multiple installation sections, wherein the component mounter device further includes:
among the multiple installation sections, an installation section specifying device which specifies an installation section to which the passage-equipped component case exchange unit is attached, and wherein, based on a specification result of the installation section specifying device, the head moving device exchanges the leading passage-equipped component case and the following passage-equipped component case by the passage-equipped component case exchange device.

2. The component mounter device according to claim 1, further comprising:
a passage-equipped component case holding device which detachably holds one or more of the following passage-equipped component cases.

3. The component mounter device according to claim 1, further comprising:
a following passage-equipped component case moving device to move the following passage-equipped component case from a position outside of the head moving region, which is a region where the mounting head can be moved by the head moving device, to a position inside the head moving region.

4. The component mounter device according claim 1, further comprising:
a bulk component type acquisition device which can acquire the type of bulk components housed in the following passage-equipped component case held on the mounting head; and
at least one of a reporting device which reports a fact that there is a difference when the bulk component type acquired by that bulk component type acquisition device is different from a planned bulk component type, and a mounting operation prohibition section which prohibits a component mounting operation of the component mounter device.

5. A bulk component supply device which is moved together with a mounting head for mounting electronic circuit components on a circuit substrate, comprising:

a bulk component case which houses electronic circuit components in a loosely packed and non-aligned state as bulk components;

a component passage which arranges bulk components in a line and guides the bulk components to a component supply section; and a bulk component transfer device which transfers bulk components from the bulk component case to the component passage and which is equipped with a bulk component driving device which applies moving force in a direction of the component passage to bulk components in the non-aligned state inside the bulk component case so that the bulk components enter the component passage, and are arranged in a line from the non-aligned state, wherein the bulk component case and the component passage are fixed to each other to configure a passage-equipped component case, and wherein a leading passage-equipped component case, which is the passage-equipped component case which is moved together with the mounting head, and a following passage-equipped component case, which is a separate passage-equipped component case to the leading passage-equipped component case, are exchangeable with at least a driving source of the bulk component driving device being held on the mounting head, wherein the bulk component case includes first and second case members which are fixed fitting to each other, the bulk component case is provided with a guiding groove, a housing chamber, a guiding passage, and a component inlet, wherein the guiding groove is formed in the first case member, wherein the housing chamber is formed by covering a concavity formed in the second case member by the first case member, the bulk components being stored in the housing chamber, wherein the guiding passage is formed of an annular section groove which connects the guiding groove to a vertical groove, and wherein the component inlet is provided at an upper section of the second case member, the bulk components entering the housing chamber through the component inlet.

* * * * *